United States Patent
Hashimoto et al.

(10) Patent No.: US 9,240,675 B2
(45) Date of Patent: Jan. 19, 2016

(54) QUANTUM CASCADE LASER
(71) Applicant: SUMITOMO ELECTRIC INDUSTRIES, LTD., Osaka-shi, Osaka (JP)
(72) Inventors: Jun-ichi Hashimoto, Chigasaki (JP); Michio Murata, Yokohama (JP)
(73) Assignee: SUMITOMO ELECTRIC INDUSTRIES, LTD., Osaka (JP)
(*) Notice: Subject to any disclaimer, the term of this patent is extended or adjusted under 35 U.S.C. 154(b) by 0 days.
(21) Appl. No.: 14/292,250
(22) Filed: May 30, 2014
(65) Prior Publication Data
US 2014/0355637 A1 Dec. 4, 2014
(30) Foreign Application Priority Data May 31, 2013 (JP) ................................ 2013-115868

(51) Int. Cl.
*H01S 5/00* (2006.01)
*H01S 5/34* (2006.01)
*H01S 5/343* (2006.01)
*H01S 5/227* (2006.01)
*B82Y 20/00* (2011.01)
(Continued)
(52) U.S. Cl.
CPC ............ *H01S 5/3401* (2013.01); *H01S 5/2275* (2013.01); *H01S 5/3402* (2013.01); *H01S 5/34313* (2013.01); *B82Y 20/00* (2013.01); *H01S 5/12* (2013.01); *H01S 5/2213* (2013.01); *H01S 5/2224* (2013.01); *H01S 5/4031* (2013.01); *H01S 5/4068* (2013.01); *H01S 5/4087* (2013.01)
(58) Field of Classification Search
CPC ... H01S 5/1014; H01S 5/1032; H01S 5/1039; H01S 5/1092; H01S 5/1096; H01S 5/12; H01S 5/1215; H01S 5/125; H01S 5/141; H01S 5/183

USPC .......................... 372/45.012, 39, 41
See application file for complete search history.

(56) References Cited

U.S. PATENT DOCUMENTS 4,644,553 A * 2/1987 Van Ruyven .......... B82Y 20/00
257/22
4,727,557 A * 2/1988 Burnham et al. .......... 372/50.12
(Continued)

OTHER PUBLICATIONS

G.M. de Naurois et al., "*High Thermal Performance of μ-Stripes Quantum Cascade Laser*", Applied Physics Letters, vol. 101, 041113, 2012.
(Continued)

*Primary Examiner* — Tod T Van Roy
*Assistant Examiner* — Vu A Vu
(74) *Attorney, Agent, or Firm* — Smith, Gambrell & Russell LLP.

(57) ABSTRACT

A quantum cascade laser includes a semiconductor substrate including a principal surface; a mesa waveguide disposed on the principal surface of the semiconductor substrate, the mesa waveguide including a light emitting region and an upper cladding layer disposed on the light emitting region, the mesa waveguide extending in a direction orthogonal to a reference direction; and a current blocking layer formed on a side surface of the mesa waveguide. The light emitting region includes a plurality of core regions and a plurality of buried regions. The core regions and the buried regions are alternately arranged in the reference direction. The core region at a central portion of the mesa waveguide has a width larger than a width of the core region at a peripheral portion of the mesa waveguide in the reference direction.

12 Claims, 24 Drawing Sheets

(51) Int. Cl.
*H01S 5/12* (2006.01)
*H01S 5/40* (2006.01)
*H01S 5/22* (2006.01)

(56) References Cited

U.S. PATENT DOCUMENTS

| | | | | |
|---|---|---|---|---|
| 4,751,711 | A | * | 6/1988 | Welch et al. ............. 372/50.123 |
| 4,860,298 | A | * | 8/1989 | Botez et al. ............. 372/50.123 |
| 5,953,356 | A | * | 9/1999 | Botez .................... B82Y 20/00 372/45.01 |
| 6,567,445 | B1 | * | 5/2003 | Narui .................... H01S 5/4031 372/36 |
| 8,003,995 | B2 | * | 8/2011 | Murata ........................... 257/80 |
| 2010/0111127 | A1 | * | 5/2010 | Edamura et al. ......... 372/45.012 |
| 2013/0243025 | A1 | * | 9/2013 | Motoda ............... H01S 5/02461 372/46.01 |

OTHER PUBLICATIONS

G.M. de Naurois et al., "*Coherent Quantum Cascade Laser Micro-Stripe Arrays*", AIP Advances, 1, 032165 2011.

Specification and drawings of co-filed application also entitled Quantum Cascade Layer and also by inventors J. Hashimoto and M. Murata.

Office Action dated Sep. 25, 2014 in related U.S. Appl. No. 14/292,291.

* cited by examiner

FIG. 4

| S (μm) | W2/W1=1 | | W2/W1=0.125 | |
|---|---|---|---|---|
| | Temperature difference (K) | Peak gain wavelength difference (nm) | Temperature difference (K) | Peak gain wavelength difference (nm) |
| 0.5 | 2.7 | 3.0 | 25.4 | 28.0 |
| 1 | 2.3 | 2.5 | 26.0 | 28.7 |
| 2 | 2.1 | 2.3 | 27.0 | 29.7 |
| 3 | 1.8 | 2.0 | 27.7 | 30.5 |

QUANTUM CASCADE LASER

BACKGROUND OF THE INVENTION

1. Field of the Invention

The present invention relates to a quantum cascade laser.

2. Description of the Related Art

A quantum cascade laser (QCL) emits light of a mid-infrared wavelength range of approximately 3 μm to 20 μm. (A quantum cascade laser may hereunder be referred to as "QCL".) Light of the mid-infrared wavelength range is used in environmental gas analysis, medical diagnosis, and industrial processing. Therefore, a quantum cascade laser is used in these fields. In particular, a quantum well cascade laser is small, has high-speed characteristics, and is low in cost. Therefore, the quantum well cascade laser is promising as a light source of the mid-infrared wavelength range. As an exemplary structure of such a QCL, a multi-core structure (divided-core structure) in which a core region of the QCL is divided into a plurality of tiny regions is proposed. Such a QCL is described in, for example, "Applied Physics Letters, vol. 101, 041113, 2012" (Non Patent Literature 1 (NPL 1)) and "AIP ADVANCES, 1, 032165, 2011" (Non Patent Literature 2 (NPL 2)).

For example, the structure that is described in NPL 2 is schematically shown in FIG. 23. As shown in FIG. 23, in a QCL having a divided-core structure, buried regions having a width D are formed between many core regions (such as 16 regions) having a uniform width W. The buried regions are formed of InP. InP is a semiconductor material providing good thermal conductivity among semiconductor materials usable in QCLs of the mid-infrared wavelength range. Further, similarly to the buried regions, an upper layer at an upper side of the buried regions and a lower layer at a lower side of the buried regions are also formed of InP. By such a divided-core structure, heat generated at the core regions is transmitted in a direction that is parallel to a principal surface of a substrate and perpendicular to a waveguide direction (hereunder referred to as "transverse direction") via the buried regions, and is efficiently dissipated to the outside of the core regions. In other words, by such a divided-core structure, heat dissipation in the transverse direction at each core region is improved.

As a result, compared to conventional QCLs in which core regions are not divided, the QCL having the divided-core structure is capable of sufficiently suppressing a temperature rise of each core region during operating. Therefore, QCL characteristics are improved; for example, light output is increased and maximum operating temperature is enhanced. NPL 1 actually reports that the QCL having the divided-core structure has a smaller thermal resistance, as compared to conventional QCLs in which core regions are not divided.

SUMMARY OF THE INVENTION

However, in QCLs having a divided-core structure, the core regions are divided with a uniform width. In this structure, the wavelength range (gain spectrum) in which an optical gain is obtained is narrowed. Therefore, in QCLs having a divided-core structure, it is difficult to realize a broad gain spectrum.

In a divided-core structure, heat dissipation at each core region is improved as mentioned above. Each of the divided core regions has a heat transfer path through which heat passes to the outside of the QCL device. However, among the divided core regions, the core region at a central portion of the QCL device has a heat transfer path longer than that of the core region at a peripheral portion of the QCL device in the direction in which the divided core regions are disposed side by side (transverse direction). Therefore, heat generated at the core region in the central portion of the QCL device is not easily dissipated. Consequently, during the operation of the QCL, the temperature of the core region at the central portion of the QCL device tends to be higher than the temperature of the core region at the peripheral portion of the QCL device. As a result, a temperature distribution occurs in the plurality of divided core regions. Here, the gain spectra of the core regions are a function of the temperatures of the core regions. Consequently, temperature variations in the core regions also cause variations in the gain spectra of the core regions.

However, the core regions are divided with a uniform width in the transverse direction orthogonal to the longitudinal direction. Due to this structure, there is not much difference between the heat dissipations of the core regions. Therefore, there is not much difference between the temperatures of the core regions when operating the QCL. Consequently, as shown by a spectrum Sp1 in FIG. 24A, the variation in gain spectrum distributions of the core regions is also small. As a result, an entire gain spectrum (spectrum Sp2 shown in FIG. 24A) of the QCL device has a relatively narrow bandwidth. Here, the entire gain spectrum (spectrum Sp2 shown in FIG. 24A) is obtained by adding the gain spectrum of each core region. The QCL device may emit light having a wavelength in the entire gain spectrum having a relatively narrow bandwidth.

In a QCL having such a gain spectrum of a narrow bandwidth, it is difficult to change an emission wavelength in a wide wavelength range. Therefore, in divided-core structures having a uniform width of the core regions, it is difficult to realize a light source such as a tunable laser and a multi-wavelength semiconductor laser array having a wide emission wavelength band. The vertical axes in FIGS. 24A and 24B represent an optical gain of QCL. The horizontal axes in FIGS. 24A and 24B represent wavelength.

A quantum cascade laser according to the present invention includes a semiconductor substrate including a principal surface; a mesa waveguide disposed on the principal surface of the semiconductor substrate, the mesa waveguide including a light emitting region and an upper cladding layer disposed on the light emitting region, the mesa waveguide extending in a direction orthogonal to a reference direction; and a current blocking layer formed on a side surface of the mesa waveguide. The light emitting region includes a plurality of core regions and a plurality of buried regions. The core regions and the buried regions are alternately arranged in the reference direction. In addition, the core region at a central portion of the mesa waveguide has a width larger than a width of the core region at a peripheral portion of the mesa waveguide in the reference direction.

According to the quantum cascade laser (QCL), the core region at the central portion has a width larger than a width of the core region at the peripheral portion of the mesa waveguide in the reference direction. In the QCL, the temperature difference between the core regions is considerably large. Thus, it is possible to sufficiently broaden the bandwidth of the entire gain spectrum of the QCL device. Consequently, the QCL device can be used for a broadband light source, such as a tunable laser.

In the quantum cascade laser according to the present invention, the core region may have a width in a range of 0.5 μm to 10 μm in the reference direction. When the width of each core region becomes less than 0.5 μm, it is difficult to ensure reproducibility of each core region width in an etching process. On the other hand, for stable oscillation in a fundamental mode and high-temperature operation, the width of each core region is preferably within approximately 10 μm. Consequently, it is desirable that the width of each core region is in the range of approximately 0.5 μm to 10 μm.

In the quantum cascade laser according to the present invention, the buried region may have a width in a range of 0.5 μm to 10 μm in the reference direction. When the width of each buried region is less than 0.5 μm, for example, an abnormal growth occurs in the selective growth of the buried region. On the other hand, in order to optically couple the divided core regions with each other, the width of each buried region is set to be approximately 10 μm or less. In the range of the width of the buried region, a single waveguiding mode is generated in the mesa waveguide. Therefore, it is desirable that the width of each buried region is in the range of approximately 0.5 μm to 10 μm.

In the quantum cascade laser according to the present invention, the light emitting region may include a first core region and a second core region. The first core region may be arranged between the second core regions. In addition, the second core region preferably has a width in a range of 0.125 times to less than 1 times a width of the first core region in the reference direction. When the width of each of the second core regions in the reference direction is in the range of 0.125 times to less than 1 times the width of the first core region in the reference direction, it is possible to increase the gain spectrum bandwidth to a value of approximately 30 nm. The bandwidth of 30 nm is broad enough to use the QCL device for a broadband light source, such as a tunable laser.

In the quantum cascade laser according to the present invention, the buried region is preferably extended in a normal direction of the principal surface and in a direction opposite to the normal direction so as to protrude from the light emitting region. Since the buried regions having a high resistance are extended to a region other than the light-emitting region, the resistance between the divided core regions becomes high, so that insulation property is improved. Therefore, leakage current that flows between the core regions is reduced. As a result, it is possible to improve QCL characteristics; for example, threshold current can be reduced.

In the quantum cascade laser according to the present invention, the current blocking layer may be formed of an insulating film. In addition, the insulating film may be formed of at least one of $SiO_2$, SiON, SiN, alumina, BCB resin, and polyimide resin.

In the quantum cascade laser according to the present invention, the current blocking layer may be formed of a semi-insulating semiconductor. In addition, the current blocking layer may be formed of InP or AlInAs doped with at least one of Fe, Ti, Cr, and Co. Since a semi-insulating semiconductor has high resistance to electrons, the semi-insulating semiconductor is suitable for constituting the current blocking layer. In addition, a semi-insulating semiconductor has a low absorption coefficient for light having a mid-infrared wavelength. Therefore, even when the current blocking layer formed of such a semi-insulating semiconductor is introduced, good characteristics are maintained. Further, a semi-insulating semiconductor has high thermal conductivity. When such a semi-insulating semiconductor is used in the current blocking layer, the heat dissipation of the QCL device is improved, so that high-temperature operations are possible.

In the quantum cascade laser according to the present invention, the buried region may be formed of a semi-insulating semiconductor. In addition, the buried region may be formed of InP or AlInAs doped with at least one of Fe, Ti, Cr, and Co. Since a semi-insulating semiconductor has high resistance to electrons and high thermal conductivity, the semi-insulating semiconductor is suitable for constituting the buried regions. In addition, a semi-insulating semiconductor has a low absorption coefficient for light having a mid-infrared wavelength. Therefore, even when the buried region formed of such a semi-insulating semiconductor is introduced, a waveguide loss is not increased, so that good characteristics are maintained.

In the quantum cascade laser according to the present invention, each of the plurality of core regions preferably includes a plurality of active layers and a plurality of injection layers. The plurality of active layers and the plurality of injection layers may be alternately stacked on the principal surface. Each of the plurality of active layers may emit light. In addition, each of the plurality of injection layers may inject carriers into the plurality of active layers that are adjacent thereto, respectively.

BRIEF DESCRIPTION OF THE DRAWINGS

FIG. 4 shows a table illustrating effects of the quantum cascade laser according to the embodiment.

DESCRIPTION OF THE PREFERRED EMBODIMENTS

Figure 1:
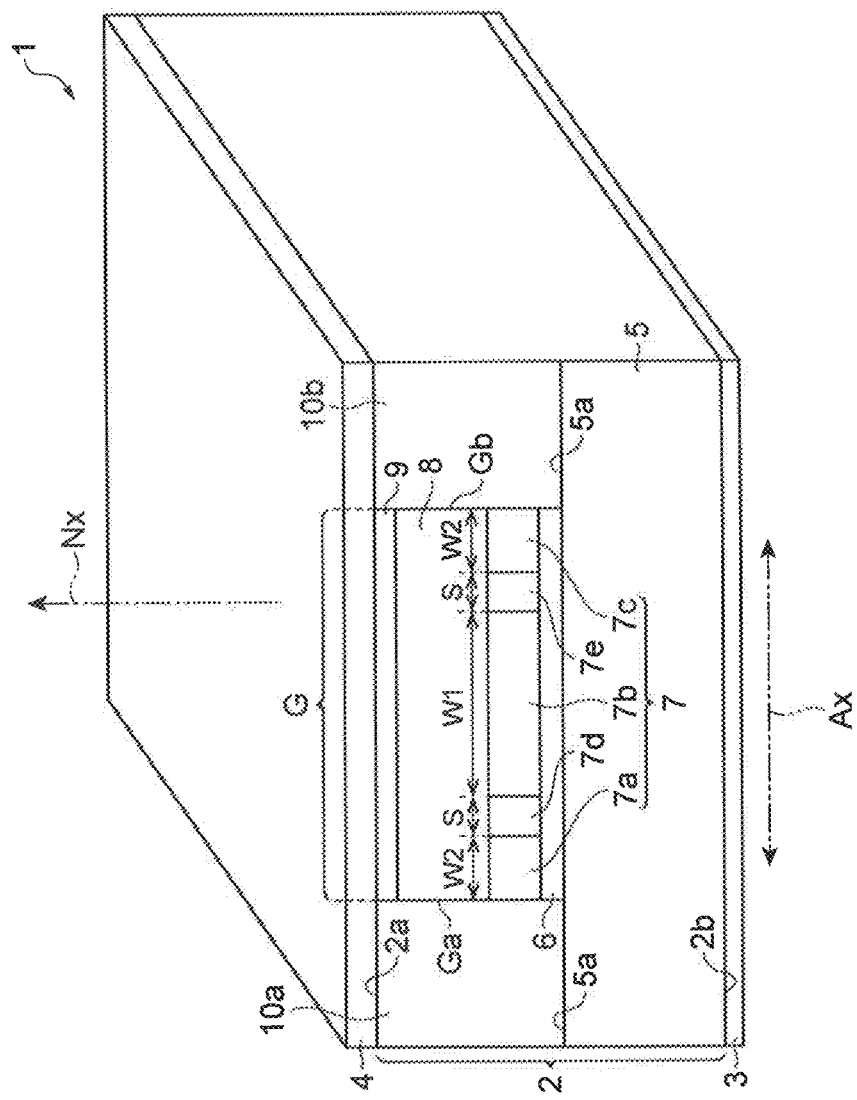
FIG. 1 shows a structure of a quantum cascade laser according to an embodiment.

Preferred embodiments of the present invention are described in detail below with reference to the drawings. In describing the drawings, if possible, corresponding parts are given the same reference numerals and the same descriptions thereof are not repeated. Quantum cascade lasers (QCLs) according to first to third embodiments below each have a buried heterostructure (hereunder referred to as "BH structure").

First Embodiment

FIG. 1 illustrates a quantum cascade laser 1 according to the first embodiment. FIG. 1 illustrates an external shape of the quantum cascade laser 1 and an internal structure of the quantum cascade laser 1 in a plane that is perpendicular to a waveguide (that is, a plane defined by a normal direction Nx and a reference direction Ax described later). The quantum cascade laser 1 includes a semiconductor layer 2, a lower electrode 3, and an upper electrode 4. The lower electrode 3 is provided on a back surface 2b of the semiconductor layer 2. The upper electrode 4 is provided on a principal surface 2a of the semiconductor layer 2. The semiconductor layer 2 of the quantum cascade laser 1 includes an n-type semiconductor substrate 5, a mesa waveguide G, a current blocking layer 10a, and a current blocking layer 10b. The mesa waveguide G is provided on a principal surface 5a of the n-type semiconductor substrate 5. The lower electrode 3 is provided on a back surface of the n-type semiconductor substrate 5 (that is, the back surface 2b of the semiconductor layer 2 that is disposed opposite to the principal surface 5a). The mesa waveguide G includes an n-type lower cladding layer 6, a light emitting region 7, an n-type upper cladding layer 8, and an n-type contact layer 9. The mesa waveguide G is provided at a central portion of the quantum cascade laser 1 in the reference direction Ax. The reference direction Ax is parallel to the principal surface 5a and is orthogonal to the direction in which the mesa waveguide G extends. That is, the reference direction Ax is parallel to a transverse direction of the mesa waveguide G (hereinafter referred to as "transverse direction"). The reference direction Ax is also orthogonal to a longitudinal direction of the mesa waveguide G (hereinafter referred to as "longitudinal direction").

The quantum cascade laser 1 has a BH structure used to confine a current into the mesa waveguide G. In the BH structure of the quantum cascade laser 1, the current blocking layers 10a and 10b formed of semi-insulating semiconductors are formed on respective sides of the mesa waveguide G. The mesa waveguide G is buried with the current blocking layers 10a and 10b. The current blocking layer 10a is provided on a side surface Ga of the mesa waveguide G. The current blocking layer 10b is provided on a side surface Gb of the mesa waveguide G. The side surfaces Ga and Gb both cross the reference direction Ax. The current blocking layer 100a, the mesa waveguide C; and the current blocking layer 10b are sequentially disposed on the principal surface 5a in the reference direction Ax. An upper surface of the current blocking layer 10a, an upper surface of the mesa waveguide G, and an upper surface of the current blocking layer 10b form one surface (that is, the principal surface 2a of the semiconductor layer 2). The upper electrode 4 is formed on the principal surface 2a.

The n-type upper cladding layer 8 is provided on an upper portion of the light emitting region 7 in the normal direction Nx. The normal direction Nx is orthogonal to the principal surface 5a. The light emitting region 7 is provided between the principal surface 5a and the n-type upper cladding layer 8. The light emitting region 7 has a structure in which a core region is divided into a plurality of core regions. The light emitting region 7 includes the plurality of core regions and a plurality of buried regions. In the embodiment, for example, the quantum cascade laser 1 has three core regions, that is, a first core region 7b and second core regions 7a and 7c. The first core region 7b is disposed at a central portion of the mesa waveguide G in the reference direction Ax. The second core regions 7a and 7c are disposed on respective sides of the first core region 7b in the reference direction Ax. In addition, the quantum cascade laser 1 has two buried regions, that is, a buried region 7d and a buried region 7e. The buried region 7d is disposed between the first core region 7b and second core region 7a. The buried region 7e is disposed between the first core region 7b and second core region 7c.

The second core region 7a, the first core region 7b, and the second core region 7c are semiconductor layers of the QCL. The second core region 7a, the first core region 7b, and the second core region 7c are sequentially provided on the principal surface 5a in the reference direction Ax. The second core region 7a and the second core region 7c are provided on the respective sides of the first core region 7b in the reference direction Ax as described above. The second core region 7a is provided on the side surface Ga of the mesa waveguide G. The second core region 7c is provided on the side surface Gb of the mesa waveguide G. The first core region 7b is provided between the second core region 7a and the second core region 7c. The first core region 7b is provided at the central portion of the mesa waveguide G in the reference direction Ax. The buried region 7d and the buried region 7e are sequentially provided on the principal surface 5a in the reference direction Ax. The second core region 7a, the buried region 7d, the first core region 7b, the buried region 7e, and the second core region 7c are alternately provided on the principal surface 5a in the reference direction Ax. In this way, the buried regions are formed between the divided core regions.

The width of the first core region 7b is larger than the widths of the second core regions 7a and 7c in the reference direction Ax. Desirably, each of the second core regions 7a and 7c in the reference direction Ax has a width W2 in the range of 0.125 times to less than 1 times a width W1 of the first core region 7b in the reference direction Ax. More specifically, in the quantum cascade laser 1, the second core region 7a and the second core region 7c have the same width W2 in the reference direction Ax, and the width W2 is less than the width W1 of the first core region 7b. The width W2 of each of the second core regions 7a and 7c in the reference direction Ax and the width W1 of the first core region 7b in the reference direction Ax are in the range of 0.5 μm to 10 μm.

The width of the buried region 7d in the reference direction Ax and the width of the buried region 7e in the reference direction Ax are the same width S. The width S of each of the buried regions 7d and 7e in the reference direction Ax is in the range of 0.5 μm to 10 μm.

The n-type semiconductor substrate 5 is described in more detail. The n-type semiconductor substrate 5 is made of, for example, an n-type InP. The semiconductor layers of the QCL (n-type lower cladding layer 6, the second core region 7a, the first core region 7b, the second core region 7c, the buried region 7d, the buried region 7e, the n-type upper cladding layer 8, the n-type contact layer 9, the current blocking layer 10a, and the current blocking layer 10b) are formed of a semiconductor material having a lattice constant that is close to that of InP. Therefore, the semiconductor layers of the QCL have a good crystal quality when the semiconductor layers of the QCL are grown on a InP substrate. Since the InP substrate is transparent to light having a mid-infrared wavelength, it is possible to use the InP substrate as the n-type lower cladding layer 6. Therefore, the n-type lower cladding layer 6 may be omitted.

The n-type lower cladding layer 6 and the n-type upper cladding layer 8 are described in more detail. The n-type lower cladding layer 6 and the n-type upper cladding layer 8 are each formed of, for example, an n-type InP. As mentioned above, InP is transparent to light having a mid-infrared wavelength. Therefore, each of the n-type lower cladding layer 6 and the n-type upper cladding layer 8 is made of InP. When the n-type lower cladding layer 6 and the n-type upper cladding layer 8 are made of InP, the n-type lower cladding layer 6 and the n-type upper cladding layer 8 having good crystal quality are easily grown on the n-type semiconductor substrate 5 composed of InP. Further, InP has good thermal conductivity. Therefore, when InP is used for each of the n-type lower cladding layer 6 and the n-type upper cladding layer 8, good heat dissipation from the second core region 7a, the first core region 7b, and the second core region 7c is ensured. As a result, the temperature characteristics of the quantum cascade laser (QCL) 1 are improved.

Figure 2:
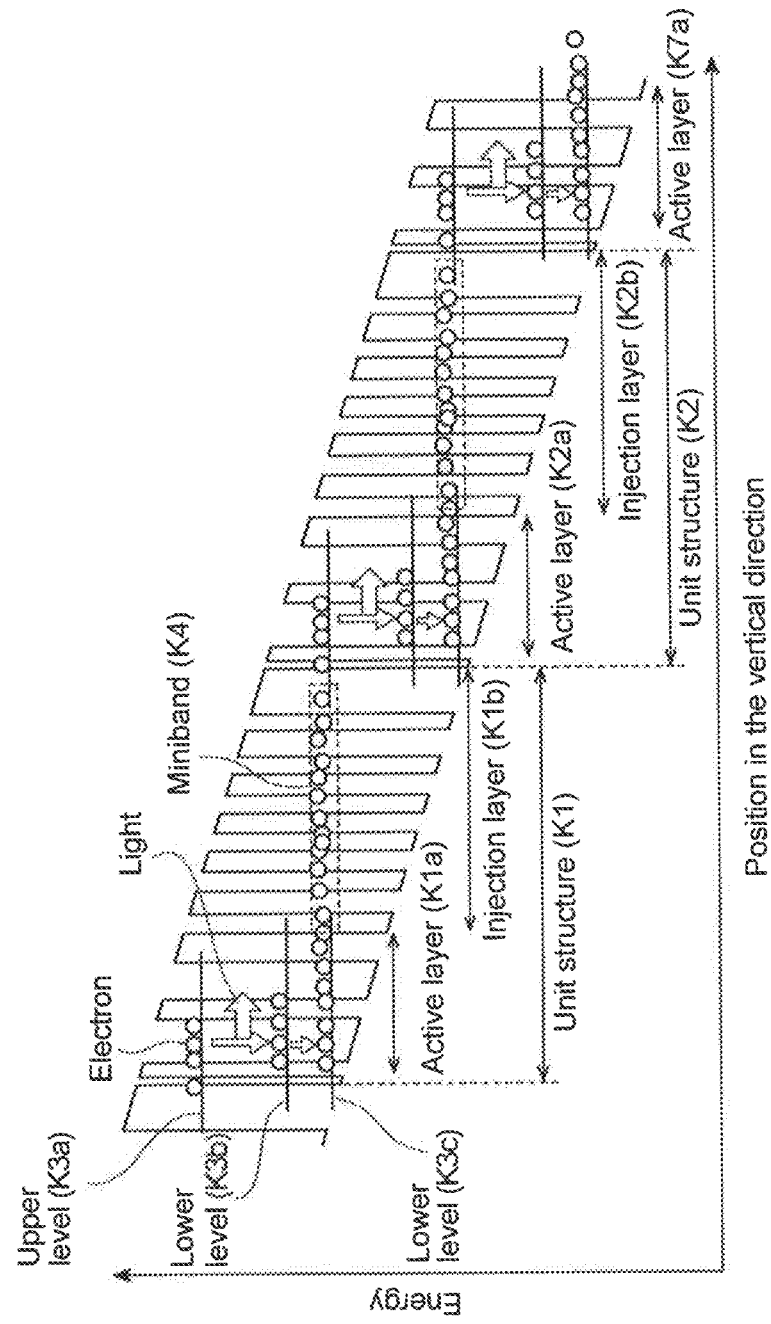
FIG. 2 shows a structure of a core region and an operation at the core region according to the embodiment.

The second core region 7a, the first core region 7b, and the second core region 7c have the same structure except that the width of the first core region 7b differs from that of each of the second core regions 7a and 7c in the reference direction Ax. Therefore, of the structures of the second core region 7a, the first core region 7b, and the second core region 7c, for example, the structure of the second core region 7a is described in more detail. As shown schematically in FIG. 2, the second core region 7a has unit structures that are subjected to multiple connections in several tens of periods. Each of the unit structures of the second core region 7a includes an active layer and an injection layer. Each of the active layers and the injection layers has a super-lattice structure in which quantum well layers K5 and barrier layers K6 are alternately stacked upon each other. Each quantum well layer K5 has a thickness of a few nanometers (nm). Each barrier layer K6 similarly has a thickness of a few nm, and has a band gap energy higher than that of each quantum well layer K5. The vertical axis of FIG. 2 represents conduction band energy. The horizontal axis of FIG. 2 represents position coordinates in the normal direction Nx.

The structure of the second core region 7a is described in more detail with reference to FIG. 2. The second core region 7a includes a plurality of unit structures, such as a unit structure K1 and a unit structure K2. The plurality of unit structures, such as the unit structure K1 and the unit structure K2, have the same structure. The plurality of unit structures are sequentially provided in the normal direction Nx. The unit structure K1 includes an active layer K1a and an injection layer K1b. The unit structure K2 includes an active layer K2a and an injection layer K2b. The active layer K1a, the injection layer K1b, the active layer K2a, the injection layer K2b, and an active layer K7a are sequentially provided in the normal direction Nx (upward direction of the principal surface Sa). For example, the injection layer K1b allows a carrier to be injected into the adjacent active layer K2a. The plurality of active layers, such as the active layer K1a, and the plurality of injection layers, such as the injection layer K1b, each have a super-lattice structure formed of GaInAs/AlInAs.

Next, the light emission principles of the QCL are simply described with reference to FIG. 2. FIG. 2 shows, for example, the structure of the second core region 7a. In the QCL, only electrons are used as carriers. In the QCL, light emission occurs as a result of intersubband electron transition in the conduction band. As shown in FIG. 2, each active layer having a super-lattice structure is provided with three sub-band levels, that is, an upper sub-band level K3a, a lower sub-band level K3b, and a lower sub-band level K3c. As shown in FIG. 2, an electron transport path, which is called a mini band K4, where many sub-band levels are provided close together, is formed in each injection layer by applying an electric field in the core regions.

Here, a voltage is applied between the lower electrode 3 and the upper electrode 4 to generate a predetermined electric field in the core regions, such as the second core region 7a. As shown in FIG. 2, electrons are injected from the n-type upper cladding layer 8 into the upper sub-band level K3a of the active layer K1a at a high potential side for the electrons, and transit to the lower sub-band level K3b. When the electrons transit from the upper sub-band level K3a to the lower sub-band level K3b, light having a wavelength corresponding to the energy difference between these sub-band levels is emitted. Here, the material compositions and thicknesses of the quantum well layers K5 and the barrier layers K6 of the active layer are selected so as to adjust the energy difference between the upper sub-band level K3a and the lower sub-band level K3b. This makes it possible to emit light having a wavelength of a mid-infrared wavelength range of 3 μm to 20 μm.

In order to emit light having the mid-infrared wavelength, GaInAs is used for the quantum well layers K5 and AlInAs is used for the barrier layers K6, for example. When these materials are used in the super-lattice structures of the core region, it is possible to provide a QCL capable of oscillating at the mid-infrared wavelength range of 3 μm to 20 μm.

After transiting from the upper sub-band level K3a to the lower sub-band level K3b, the electrons transit to the lower sub-band level K3c of the active layer K1a at a high speed. The lower sub-level K3c is situated below the lower sub-level K3b. In this transition from the lower sub-band level K3b to the lower sub-band level K3c, LO phonon is emitted. Then, the electrons move through the injection layer K1b, and are injected into the upper sub-level K3a of the active layer K2a of the unit structure K2 that is adjacent to the unit structure K1. The transition of electrons from the lower sub-band level K3b to the lower sub-band level K3c occurs at a high speed. Therefore, a population inversion of carriers (electron) is efficiently provided between the lower sub-level K3b and the upper sub-level K3a. As a result, a stimulated emission occurs between the upper sub-level K3a and the lower sub-level K3b due to the population inversion, and an optical gain is also obtained. In the injection layer, as shown in FIG. 2, the electrons move through the mini band K4, and are smoothly injected into the next active layer. As in the active layer K1a, the electrons injected into the active layer K2a transit from the upper sub-band level K3a to the lower sub-band level K3b of the active layer K2a. In this transition of electrons, light having the wavelength corresponding to the energy difference between these sub-band levels is also emitted. The electrons then move through the injection layer K2b and are transferred to the active layer K7a of the unit structure that is adjacent to the unit structure K2. Subsequently, a radiative transition with emitting light is repeated in each of the unit structures. The lights emitted in all of the unit structures due to the radiative transition are added so as to generate the output light of the QCL. When an injection current is increased, an optical gain in each active layer is increased. When the optical gain becomes larger than the optical loss of the QCL, laser oscillation occurs.

As shown in FIG. 2, as the core regions, such as the second core region 7a, a structure in which injection layers and active layers are alternately connected is used. By connecting the active layers by the corresponding one of the injection layers, the electrons are smoothly and continuously transferred to the adjacent active layer. As a result, the emission of light resulting from intersubband electron transition in the conduction band occurs efficiently.

In the QCL, only electrons in the conduction band is used for the radiative transition. The emission of light occurs due to the intersubband electron transition in the conduction band. On the other hand, in a conventional semiconductor laser having a p-n junction, the emission of light occurs due to a band-to-band transition of electrons in the conduction band to the valence band, and subsequent recombination of electrons and holes in the valence band. Therefore, the conventional semiconductor laser having a p-n junction emits light on the basis of a principle that is completely different from that on the basis of which the quantum cascade laser 1 emits light.

Referring back to FIG. 1, the current blocking layers 10a and 10b will be described in more detail. The current blocking layers 10a and 10b have the same structure. Therefore, as an example, the structure of the current blocking layer 10a will be described in detail. The current blocking layer 10a is formed of a semi-insulating semiconductor such as Fe-doped InP. The semi-insulating semiconductor has a large resistance for electrons. Consequently, the semi-insulating semiconductor is suitable as a material of the current blocking layer 10a. Thus, by using the semi-insulating semiconductor for the current blocking layer 10a, it is possible to confine a current (carrier) into the mesa waveguide G.

As a semi-insulating semiconductor used for the current blocking layer 10a, for example, a III-V group compound semiconductor (first second semiconductor) doped with any one of transition metals, such as Fe, Ti, Cr, and Co, may be used. These transition metals form a deep level that traps electrons in a semiconductor forbidden band. That is, such a semiconductor has a semi-insulating property as a result of trapping electrons in a deep level. In particular, Fe is generally used as a dopant for obtaining the semi-insulating semiconductor. The III-V group compound semiconductor such as InP and AlInAs has a semi-insulating property by doping any one of the transition metals, such as Fe, Ti, Cr, and Co into the III-V group compound semiconductor. The semi-insulating semiconductor doped with any of one these transition metals has a large electrical resistivity of, for example, $10^5$ ($\Omega$ cm) or higher with respect to electrons.

For example, semi-insulating InP and AlInAs doped with any one of the transition metals, such as Fe, Ti, Cr, and Co, are lattice-matched to the n-type semiconductor substrate 5 made of InP. Therefore, the semi-insulating InP and AlInAs doped with any one of the transition metals, such as Fe, Ti, Cr, and Co are grown on the n-type semiconductor substrate 5 so as to achieve a good crystal quality.

Further, ITT-V group compound semiconductors, such as semi-insulating InP and AlInAs, doped with any one of the transition metals, such as Fe, Ti, Cr, and Co, have a low absorption coefficient for light having the mid-infrared wavelength. Therefore, even when any one of these semi-insulating semiconductors is used for the current blocking layer 10a, waveguide loss based on the light absorption does not increase. Consequently, even when a current blocking layer formed of a III-V group compound semiconductor, such as semi-insulating InP or AlInAs, doped with any one of the transition metals, such as Fe, Ti, Cr, and Co, is introduced, it is possible to maintain good QCL characteristics.

In addition, III-V group compound semiconductors, such as semi-insulating InP and AlInAs, doped with any one of the transition metals, such as Fe, Ti, Cr, and Co, have high thermal conductivity. Therefore, by using such a semi-insulating semiconductor for the current blocking layer 10a, heat dissipation of a QCL device is improved, so that a high-temperature operation is possible. Since InP has a particularly high thermal conductivity, it can be suitably used for the current blocking layer 10a.

However, AlInAs may also be used for the current blocking layer 100a. The band gap energy of AlInAs is larger than that of InP. Therefore, by using AlInAs for the current blocking layer 10a, a larger energy barrier with respect to electrons is formed at an interface between the current blocking layer 100a and each layer (that is, the n-type lower cladding layer 6, the light emitting region 7, the n-type upper cladding layer 8, and the n-type contact layer 9) of the adjacent mesa waveguide G compared to that when InP is used. Therefore, in addition to the large resistance of the semi-insulating AlInAs, the effect of the large energy barrier makes it possible to suppress the flowing of electrons into the current blocking layer 10a from the mesa waveguide G. Thus, the current blocking layer 10a made of semi-insulating AlInAs has larger resistance for the electrons. Consequently, electric current is further confined in the mesa waveguide G by using the current blocking layer 10a made of semi-insulating AlInAs.

The buried regions 7d and 7e will be described in more detail. The buried regions 7d and 7e have the same structure. Therefore, as an example, the structure of the buried region 7d will be described in detail. Electric current to the second core region 7a, the first core region 7b, and the second core region 7c needs to be confined. Therefore, as with, for example, the current blocking layer 10a, the buried region 7d also needs to have a large resistance for carriers (electrons). Consequently, as with, for example, the current blocking layer 10a, it is suitable to use a semi-insulating III-V group compound semiconductor (second semiconductor), such as InP or AlInAs, which is doped with any one of the transition metals, such as Fe, Ti, Cr, and Co. In particular, Fe is generally used as a dopant for the semi-insulating III-V group compound semiconductor.

As mentioned above, a semi-insulating III-V group compound semiconductor, such as InP or AlInAs, doped with a transition metal, such as Fe, has a low absorption coefficient for light having the mid-infrared wavelength. Therefore, even when such a semi-insulating III-V group compound semiconductor is used for the buried region 7d, waveguide loss is not increased. Further, such a semi-insulating III-V group compound semiconductor doped with a transition metal, such as Fe, has good heat transfer characteristics, and is suitable as a material of the buried region 7d. In particular, InP has high thermal conductivity, and is easily grown on the semiconductor substrate 5 composed of InP. Therefore, InP is suitable as a semiconductor of the buried region 7d.

However, AlInAs may also be used for the buried region 7d. The band gap energy of AlInAs is larger than that of InP. Therefore, by using AlInAs for the buried region 7d, the resistance of the buried region 7d for electrons is larger than that when InP is used. Consequently, it is possible to enhance the confinement of a current into the core regions, such as the second core region 7a.

Next, the n-type contact layer 9, the lower electrode 3, and the upper electrode 4 will be described. The n-type contact layer 9 is provided for making a good ohmic contact with the upper electrode 4. For example, the n-type contact layer 9 is made of n-type GaInAs. The lower and upper electrodes 3 and 4 are made of, for example, Ti/Au or Ge/Au.

In addition to the structure shown in FIG. 1, the quantum cascade laser 1 may include optical confinement regions at the upper and lower sides of the core regions, such as the second core region 7a, if necessary. The optical confinement regions enhance the confinement of light into the core regions. In this case, from the viewpoint of increasing heat dissipation at the core regions, a region including the core regions and the optical confinement regions is divided into a plurality of regions in the reference direction Ax which is parallel to a transverse direction. It is desirable that buried regions having high resistance and good thermal conductivity are formed between the divided regions. However, optical confinement regions may be not divided. The optical confinement regions are formed of materials having refractive indices that are less than those of the active layers and larger than those of the cladding layers. The optical confinement regions are formed of, for example, undoped or n-type GaInAs. Regarding the n-type contact layer 9, when the upper cladding layer 8 having a good ohmic contact with the upper electrode 4 is formed, the contact layer may be omitted. In addition, when the substrate is formed of a material (such as InP) that is transparent to light emitted from the active layers and has a lower refractive index than that of the active layer, the substrate functions as the lower cladding layer. In this case, the n-type lower cladding layer 6 need not be provided as described above. As an n-type dopant for forming each of the n-type semiconductor layers according to the embodiment, for example, Si, S, Sn, or Se is used.

Next, a calculation regarding core temperature using a specific example of the quantum cascade laser 1 according to the first embodiment is performed. Using the results of the calculation, structural improvements of the quantum cascade laser 1 according to the first embodiment over conventional structures are described.

In the embodiment, a core region of the light emitting region is divided into three regions, that is, the first core region and the two second core regions. The first core region is disposed at a central portion of the quantum cascade laser 1 in the reference direction Ax. The second core regions are disposed on respective sides of the first core region in the reference direction Ax and have the same width. The width of the first core region in the transverse direction (corresponding to the reference direction Ax) is defined as W, the width of each of the second core regions in the transverse direction is defined as W, and the width of each of buried regions between the corresponding core regions in the transverse direction is defined as S. The specific structure of each region is as follows, in which, hereunder, the term "thickness" means the thickness of each region in a direction perpendicular to the principal surface of the semiconductor substrate:

Substrate: n-InP, thickness=100 μm;
Lower cladding layer: n-InP, thickness=0.5 μm;
Core regions: light emission wavelength=7.8 μm, AlInAs/GaInAs super-lattice structures, thickness=1.4337 μm;
Upper cladding layer: n-InP, thickness=3 μm;
Contact layer: n-GaInAs, thickness=0.1 μm;
Buried regions: InP doped with Fe, thickness=1.4337 μm (same as those of the core regions); and
Current blocking layers: InP doped with Fe, thickness=5.0337 μm (same as the height of mesa waveguide).

It is assumed that the substrate is provided on a heat sink whose temperature is regulated at a constant temperature of 300 K. Therefore, it is also assumed that the temperature of the back surface of the substrate is constant at 300 K. As an example, calculations are performed using a two-dimensional thermal analysis program to find out a dependence of a difference (Tavg_1−Tavg_2) between an average temperature (Tavg_1) of the first core region and an average temperature (Tavg_2) of each second core region on a core division ratio (W2/W1) between the first core region and each of the second core regions. It is assumed that a constant driving power of 5 W is applied to the QCL. In order to evaluate the correlation between the core division ratio (W2/W1) and the difference between the average temperatures of the core regions, the applied power per unit volume of the core regions is made constant. Therefore, the total of the widths of the first core region and the second core regions (W1+W2×2) is assumed to be constant at 10 μm. The width (S) of the buried regions is set to be in the range of approximately 0.5 μm to 10 μm as mentioned below. In this structure including the buried regions having the width (S) of approximately 0.5 μm to 10 μm, the divided core regions are optically coupled with each other through the buried regions so as to generate a single waveguiding mode in the mesa waveguide G. Therefore, the width (S) of the buried regions is selected from four values, 0.5 μm, 1 μm, 2 μm, and 3 μm. A cavity length in the longitudinal direction of the mesa waveguide G is constant at 2 mm.

Figure 3:
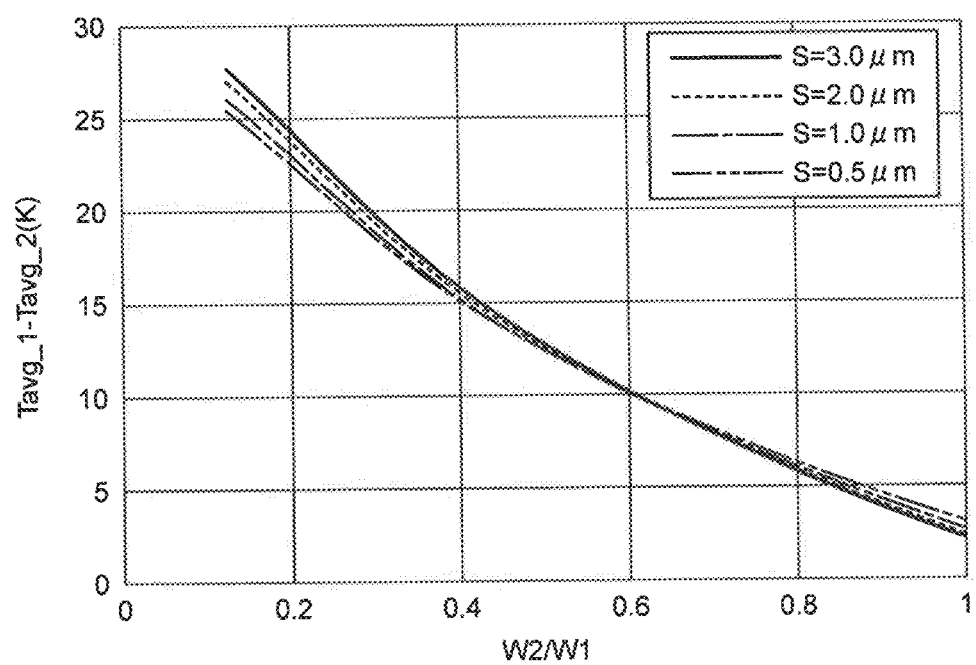
FIG. 3 shows a graph illustrating effects of the quantum cascade laser according to the embodiment.

The results of calculation of the dependence of the difference (Tavg_1−Tavg_2) between the average temperatures of the core regions (that is, the average temperature Tavg_1 of the first core region and the average temperature Tavg_2 of each of the second core regions) on the core division ratio (W2/W1) between the first core region and each of the second core regions in the range of the division ratio (W2/W1) less than or equal to 1 are shown in FIG. 3. The vertical axis of FIG. 3 represents the difference (Tavg_1−Tavg_2) between the average temperatures of the core regions. The horizontal axis of FIG. 3 represents the W2/W1 value. FIG. 3 shows that the difference between the average temperatures of the core regions substantially similarly changes with respect to the division ratio (W2/W1) between the core regions independently of the S value, and that the dependence of the difference between the average temperatures of the core regions on S is very small. The results show that, even in conventional structures in which the division ratio (W2/W1) is 1, that is, the first and second core regions are divided with the same width, the average temperature of the first core region is higher than those of the second core regions. This is due to the following reason. When the core widths are the same, a heat transfer path (used for transferring heat to the outside) of the first core region (positioned near the central portion) is longer than those of the second core regions (existing near the peripheral portions) in the transverse direction (corresponding to the reference direction Ax). Therefore, heat dissipation is poorer and heat tends to be more confined in the first core region compared with the second core regions. However, in this case, the difference between the average temperatures of the first and second core regions is less than 3 K, which is not very large.

In the embodiment, the total of the widths of the first and the second core regions is kept to be constant at 10 μm as mentioned above. Therefore, the widths of the second core regions are reduced as the width of the first core region increases. In the range of the division ratio (W2/W1) of less than 1, that is, the range in which the width (W1) of the first core region is larger than the width (W2) of the second core region, a reduction in the division ratio (W2/W1) causes the difference (Tavg_1−Tavg_2) between the temperatures of the first and second core regions to increase rapidly as shown in FIG. 3. When the division ratio (W2/W1) is reduced, the width (W1) of the first core region is increased and/or the width (W2) of the second core region is decreased. The reason why the difference between the temperatures of the first and second core regions is rapidly increased as the division ratio (W2/W1) decreases is as follows. That is, as the width of the first core region increases, the heat transfer path through which heat generated in the first core region reaches the buried regions is lengthened. Therefore, heat dissipation in the first core region in the transverse direction is reduced. As a result, the temperature of the first core region is increased. As the widths of the second core regions are reduced, the heat transfer path through which heat generated in each second core region reaches the buried regions is shortened. Therefore, heat dissipation in each second core region in the transverse direction is increased, as a result of which the temperature of each second core region is reduced.

Here, the results of the temperature difference between the first core region and each second core region and the peak gain wavelength difference (that is, difference of wavelengths at the gain peak) between the core regions estimated from the temperature difference with respect to each S value for the cases of the division ratios (W2/W1) of 1 and 0.125 are summarized in FIG. 4. In the case of the division ratio (W2/W1) of 1, the first and second core regions are divided with the same width for the conventional structure. The division ratio (W2/W1) of 0.125 is the minimum value using in the calculation. The peak gain wavelength difference is calculated by approximating that the temperature dependence of the peak gain is the same as the temperature dependence (1.1 nm/K) of the oscillation wavelength of the QCL according to the embodiment.

FIG. 4 shows that, by using the core structure having the division ratio (W2/W1) of less than 1, regardless of the S value, the peak gain wavelength differences between the divided core regions is one order of magnitude larger than those in conventional structures having the division ratio (W2/W1) of 1. In the embodiment, a wavelength difference of approximately 30 nm may be obtained. The peak gain wavelength difference between the first core region and each second core region corresponds to the gain spectrum variation between the first and second core regions. Therefore, it is possible to similarly increase the gain spectrum bandwidth of the QCL device so that the large gain spectrum bandwidth of approximately 30 nm is obtained. That is, in the range of the division ratio (W2/W1) of 0.125 to less than 1, it is possible to increase the gain spectrum bandwidth to a maximum value of approximately 30 nm n. Therefore, the structure according to the embodiment is applicable to a broadband light source, such as a tunable laser.

Figure 24A:
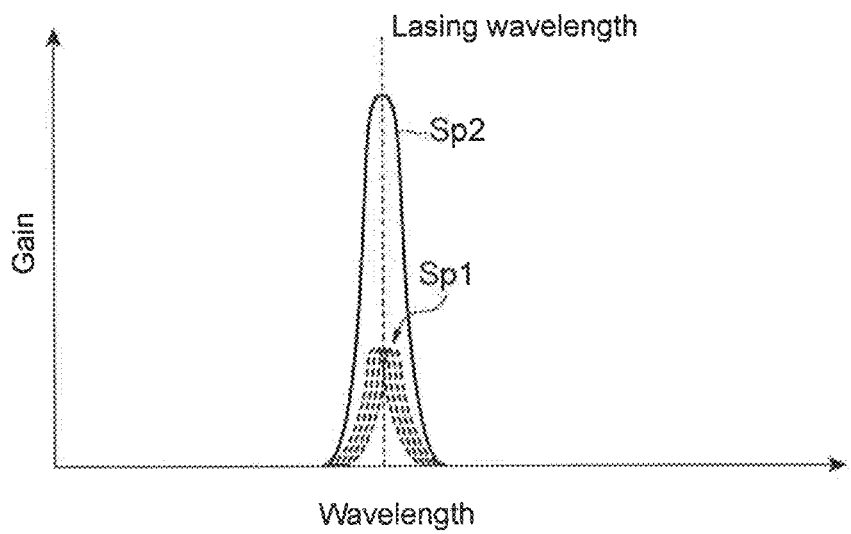
FIGS. 24A and 24B illustrate gain spectra of the conventional quantum cascade laser and a quantum cascade laser according to an embodiment.
Figure 24B:
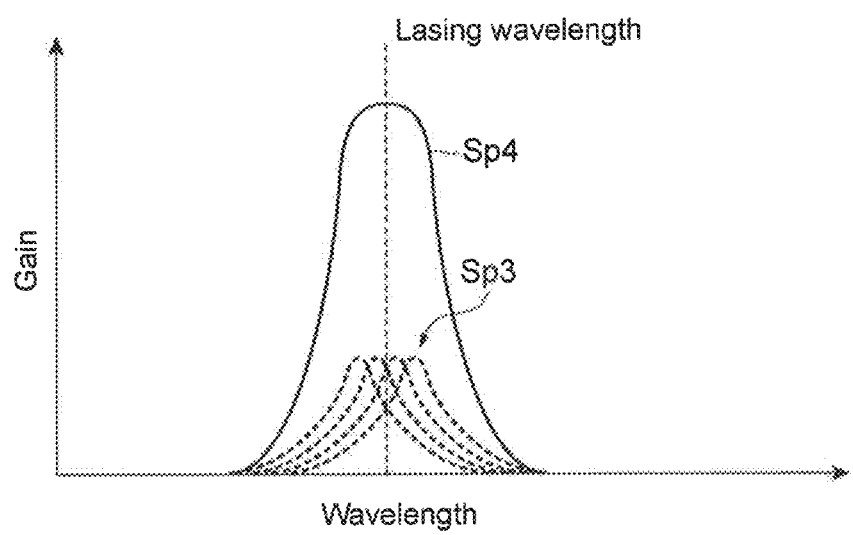

As is clear from the above, when a divided-core structure whose core division ratio (W2/W1) is less than 1, it is possible to considerably increase the temperature difference between the core regions compared to the temperature difference between the core regions in conventional structures having the core division ratio (W2/W 1) of 1. In the embodiment, a divided-core structure in which the width of the core region at the central portion is larger than those of the core regions at the peripheral portions is used. In the structure, the temperature difference between the core regions is increased. Therefore, the gain spectrum variation between the core regions is increased as indicated by a spectrum Sp3, as shown in FIG. 24B. Therefore, the entire gain spectrum Sp4 of the QCL device becomes a broadband spectrum.

Figure 5:
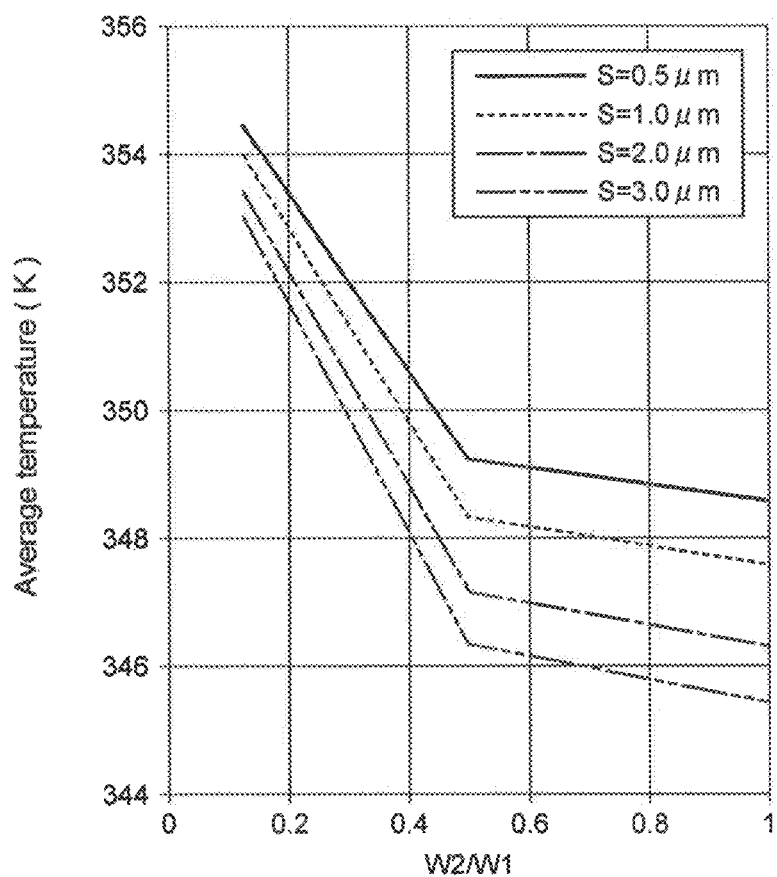
FIG. 5 shows a graph illustrating the correlation between the core division ratio (W2/W1) and the average temperature of the core regions as a whole for the quantum cascade laser according to the embodiment.

Next, similarly to the above, with the width S of each buried region being a parameter, the results of the correlation between the core division ratio (W2/W1) and the average temperature of the core regions as a whole (that is, the temperature obtained by a weighted average of the average temperature of the first core region and the average temperature of each second core region using the volume of each core region) are shown in FIG. 5. The vertical axis of FIG. 5 represents the average temperature of the core regions as a whole. The horizontal axis of FIG. 5 represents the W2/W1 value. FIG. 5 shows that, even if the core division ratio (W2/W1) is the same, the average temperature is reduced with increasing the width S of the buried region. When the width S of the buried region is increased, an area of the buried regions having good thermal conductivity is increased. As a result, the heat dissipation from the core regions is increased as a whole. When the average temperature is reduced, an optical gain at each peak wavelength in the core regions is increased, so that QCL oscillation occurs easily. Therefore, the reduction in the average temperature of the core regions as a whole is effective in improving the oscillation characteristics of the QCL.

As described using FIG. 3, the temperature difference between the first core region and each second core region does not nearly depend on the width S of the buried region. If the division ratio is the same, equivalent values of the gain spectrum bandwidth are maintained regardless of the magnitude of the width S of the buried region. Therefore, from the viewpoint of reducing the average temperature of the core regions as a whole, it is desirable to set the width S of the buried region as large as possible. However, the width S is limited to the range in which the divided core regions are optically coupled with each other through the buried regions so as to generate a single waveguiding mode in the mesa waveguide G.

Lastly, a suitable range of the widths of the core regions in the transverse direction and a suitable range of the widths of the buried regions in the transverse direction in the divided core region will be described. The divided-core structure according to the embodiment is formed by the following steps. First, after forming a core region on the entire surface of a substrate, unrequired portions of the core region (portions that become buried regions) are removed by dry etching or wet etching to divide the core region into three core regions. Thereafter, buried regions are regrown in gaps formed by etching unrequired core regions.

First, if the width of each divided core region is less than 0.5 μm, it is difficult to ensure reproducibility of such narrow core regions in the etching process. Therefore, it is desirable that the width of each divided core region is greater than or equal to 0.5 μm. In contrast, if the width of each divided core region is excessively large, it is difficult to achieve stable oscillation in a fundamental mode and high-temperature operation. Therefore, it is desirable that the width of each divided core region is less than or equal to 10 μm. Consequently, it is desirable that the width of each divided core region is in the range of approximately 0.5 μm to 10 μm.

If the width of each buried region is less than 0.5 μm, for example, abnormal growth occurs during regrowth of the buried regions. Therefore, the lower limit of the width of each buried region is approximately 0.5 μm. In contrast, the divided core regions are optically coupled with each other through the buried regions to generate a single waveguiding mode. Therefore, the width of each buried region is set to be less than or equal to approximately 10 μm. Therefore, it is desirable that the width of each buried region is in the range of approximately 0.5 μm to 10 μm.

In the foregoing description, the number of divided core regions is three. However, the number of divided core regions is not limited to three. Other numbers of divided core regions, such as an arbitrary number of divided core regions of four or more, provide similar improvements. For any of the numbers of divided core regions, when the widths of the core regions at the peripheral portions are smaller than the width of the core region at the central portion, it is possible to increase the temperature difference between the core regions compared to the temperature difference in conventional structures. As a result, the bandwidth of the entire gain spectrum of the QCL device may be widened sufficiently. Therefore, the QCL device according to the embodiment is used for a broadband light source, such as a tunable laser.

Figure 21:
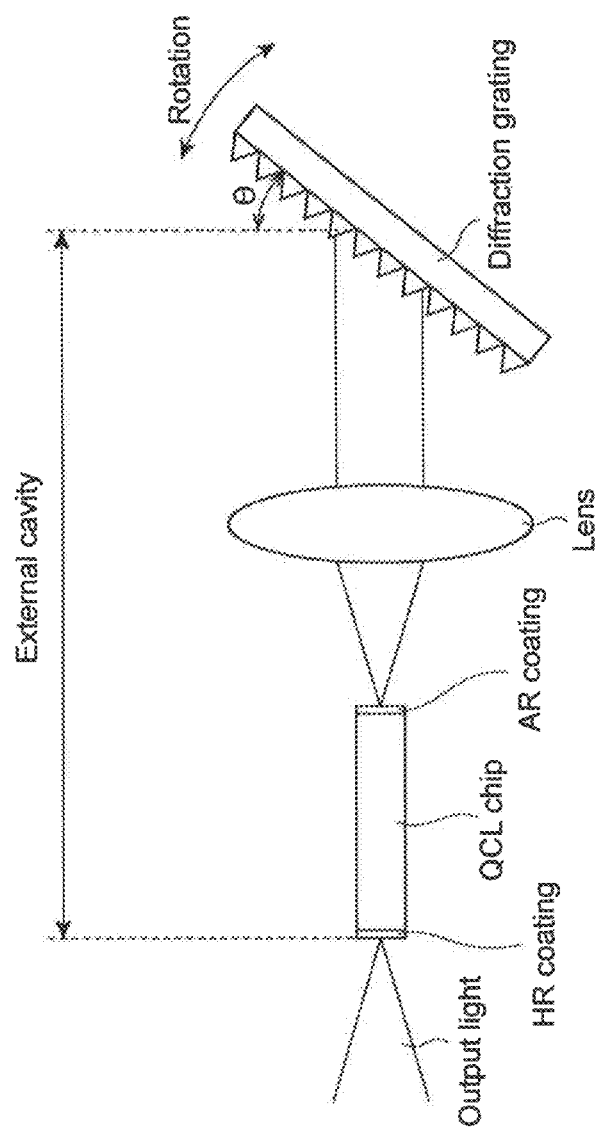
FIG. 21 shows an example of an application of a quantum cascade laser according to an embodiment.

Lastly, an exemplary broadband light source is introduced. A typical structure of an external cavity type wavelength tunable laser is shown in FIG. 21. The structure shown in FIG. 21 is what is called a Littrow type external cavity structure. The external cavity type wavelength tunable laser shown in FIG. 21 includes a QCL chip serving as a light emitting source, a collimator lens, and a diffraction grating serving as an external reflector. In the wavelength tunable laser, the diffraction grating and a front end facet of the QCL chip serve as reflectors of the external cavity, respectively.

Light that is generated by current injection into the QCL chip is emitted from a back end facet of the QCL, and is then incident upon the diffraction grating via the lens. Of the light incident upon the diffraction grating, only a light component having a particular wavelength $\lambda$ that satisfies the Bragg condition of the diffraction grating is selectively reflected. Therefore, in the external cavity, only the light having the wavelength $\lambda$ is multi-reflected and amplified, so that laser oscillation occurs and the light is emitted as laser beam from the front end facet.

Here, the diffraction grating is rotatably provided as shown in FIG. 21. In accordance with a change in an angle $\Theta$ of the diffraction grating, the wavelength that is reflected by the diffraction grating also changes, so that an oscillation wavelength also changes. Consequently, by changing the angle $\Theta$ as appropriate, the operation as the wavelength tunable laser is possible.

In order to suppress oscillation of the QCL chip itself and to perform oscillation based on the external cavity, as shown in FIG. 21, an antireflection (AR) coating is provided on the back end facet of the QCL chip. A high-reflection (HR) coating may be provided at the front end facet.

Figure 22A:
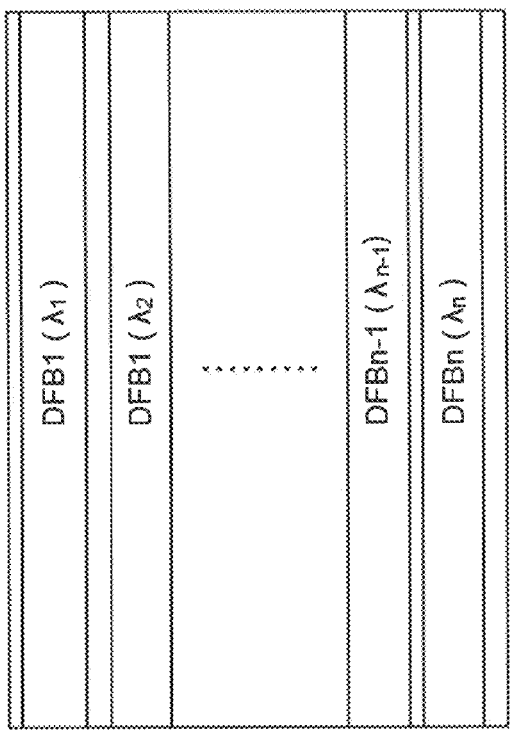
FIGS. 22A and 22B show an example of an application of a quantum cascade laser according to an embodiment.

Another type of broadband light source is a multi-wavelength semiconductor laser array. FIG. 22A shows, as an example, a multi-wavelength semiconductor laser array in which distributed feedback lasers (hereinafter referred to as "DFB lasers") capable of a single-mode oscillation are monolithically integrated on the same semiconductor substrate. As shown in FIG. 22A, an n number of DFB lasers having different oscillation wavelengths of $\lambda 1$ to $\lambda n$ are integrated. A typical DFB laser structure according to the embodiment is shown in FIG. 22B.

Figure 22B:
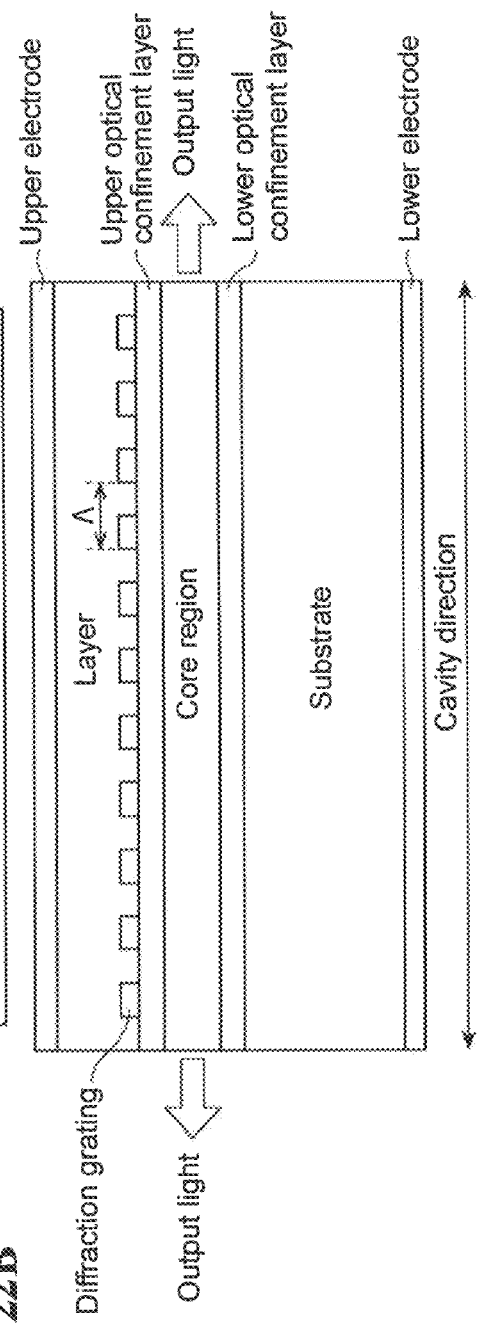
Figure 23:
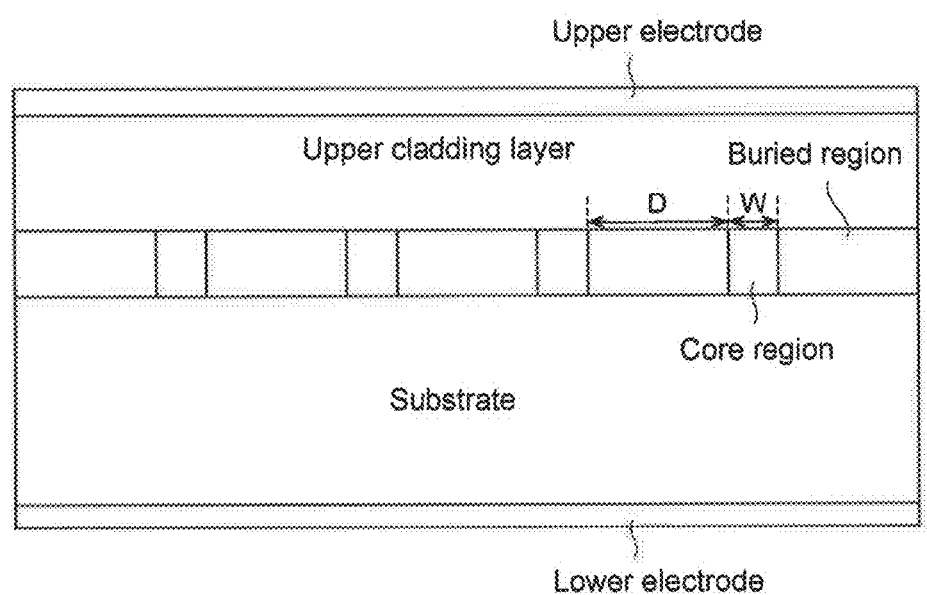
FIG. 23 shows a structure of a conventional quantum cascade laser.

FIG. 22B shows an internal structure in a cavity direction (longitudinal direction) as seen from a plane that is parallel to the normal direction Nx and orthogonal to the reference direction Ax. The internal structure is basically the same as the structure shown in FIG. 1. However, upper and lower optical confinement layers are inserted at respective sides of a core region and a diffraction grating layer including periodic projections and recesses is formed at a portion of the upper optical confinement layer. The diffraction grating layer may be formed at a portion of the lower optical confinement layer between the core region and a semiconductor substrate.

The diffraction grating may be formed of undoped or n-type GaInAs, which is the same material as those of the optical confinement layers.

Here, as shown in FIG. 22B, when the period of the projections and recesses of the diffraction grating is $\Lambda$ and the effective refractive index of each DFB laser is Ne, a reflection wavelength $\lambda$ of the diffraction grating is $\lambda=2\times Ne\times\Lambda/q$ (where q is a degree of the diffraction grating and is usually 1). The oscillation wavelength of each DFB laser is determined by the reflection wavelength $\lambda$ of the diffraction grating. However, in order for each DFB laser to oscillate, the reflection wavelength $\lambda$ needs to be included in a QCL gain spectrum. When the reflection wavelength of the diffraction grating is within the QCL gain spectrum, changing the period $\Lambda$ of the diffraction grating as appropriate allows the DFB lasers to output laser lights of an n number of wavelengths ($\lambda 1$ to $\lambda n$) that differ from each other. As the QCL gain spectrum bandwidth becomes broader, the wavelength range of each DFB laser can be more largely changed. In this way, an integrated QCL device shown in FIG. 22A operates as a multi-wavelength semiconductor laser array. As also mentioned above, the QCL according to the embodiment has a broad gain spectrum bandwidth. Therefore, by only changing the period $\Lambda$ of the diffraction grating with the core structure being the same, it is possible to easily realize a multi-wavelength semiconductor laser array having a wide oscillation wavelength range.

The diffraction gratings having different periods in the respective DFB lasers may be formed by an ordinary process technology, such as photolithography or EB exposure. The QCL devices having the broad gain spectrum bandwidth are suitable for broadband light sources, such as the wavelength tunable laser shown in FIG. 21 and the multi-wavelength semiconductor laser array shown in FIGS. 22A and 22B.

Second Embodiment

In the first embodiment, the buried regions made of a semi-insulating semiconductor are formed in only the light emitting region. In the embodiment, the buried regions are extended from the light emitting region toward outside in the normal direction of the principal surface of the n-type semiconductor substrate and in a direction opposite to the normal direction so as to protrude from the light emitting region.

Figure 6A:
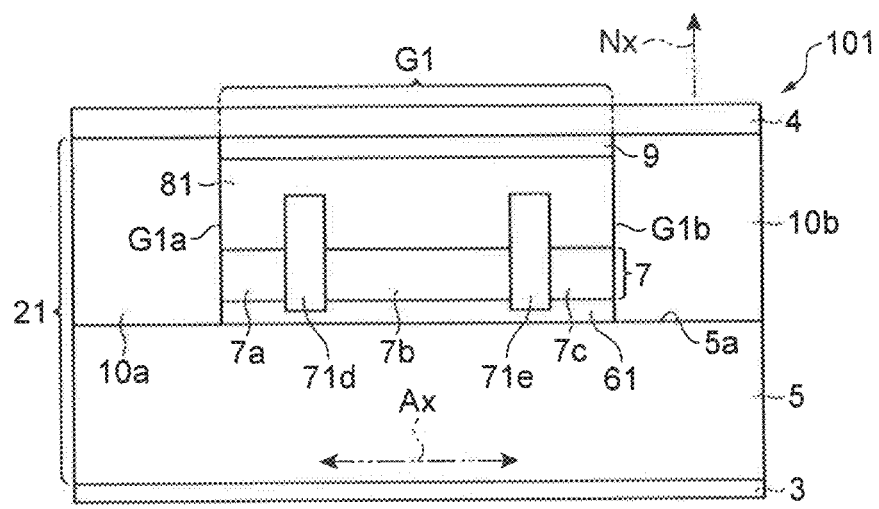
FIGS. 6A and 6B show structures of other quantum cascade lasers according to an embodiment.

In a quantum cascade laser 101 shown in FIG. 6A, buried regions (buried regions 71d and 71e) are extended from a light emitting region 7 to middle portions of upper and lower cladding layers (an n-type lower cladding layer 61 and an n-type upper cladding layer 81. Alternatively, as in a quantum cascade laser 102 shown in FIG. 6B, buried regions (buried regions 72d and 72e) may be extended from a light emitting region 7 to a substrate 5 through the lower cladding layer (an n-type lower cladding layer 62) and to an n-type contact layer 9 through the upper cladding layer (an n-type upper cladding layer 82). In the quantum cascade laser 101 and the quantum cascade laser 102, the buried regions are extended into both of the upper and lower cladding layers. However, the buried regions may be extended into a middle portion of only one of the cladding layers. Alternatively, the buried regions may be extended through the one of the cladding layers.

The quantum cascade laser 101 includes a semiconductor layer 21. The semiconductor layer 21 includes a mesa waveguide G1. The mesa waveguide G1 includes the buried region 71d and the buried region 71e. The mesa waveguide G1 also includes the n-type upper cladding layer 81 and the n-type lower cladding layer 61. A current blocking layer 10a is provided on a side surface G1a of the mesa waveguide G1. A current blocking layer 10b is provided on a side surface G1b of the mesa waveguide G1. The buried region 71d and the buried region 71e are extended to a middle portion of the n-type upper cladding layer 81 and to a middle portion of the n-type lower cladding layer 61. In this way, the quantum cascade laser 1 and the quantum cascade laser 101 differ only in the forms of the buried regions.

The quantum cascade laser 102 includes a semiconductor layer 22. The semiconductor layer 22 includes a mesa waveguide G2. The mesa waveguide G2 includes the buried region 72d and the buried region 72e. The mesa waveguide G2 also includes the n-type upper cladding layer 82 and the n-type lower cladding layer 62. A current blocking layer 10a is provided on a side surface G2a of the mesa waveguide G2. A current blocking layer 10b is provided on a side surface G2b of the mesa waveguide G2. The buried region 72d and the buried region 72e are extended through the n-type upper cladding layer 82 and reach an n-type contact layer 9. The buried region 72d and the buried region 72e are also extended through the n-type lower cladding layer 62 and reach an n-type semiconductor substrate 5. In this way, the quantum cascade laser 1 and the quantum cascade laser 102 differ only in the forms of the buried regions.

Figure 7A:
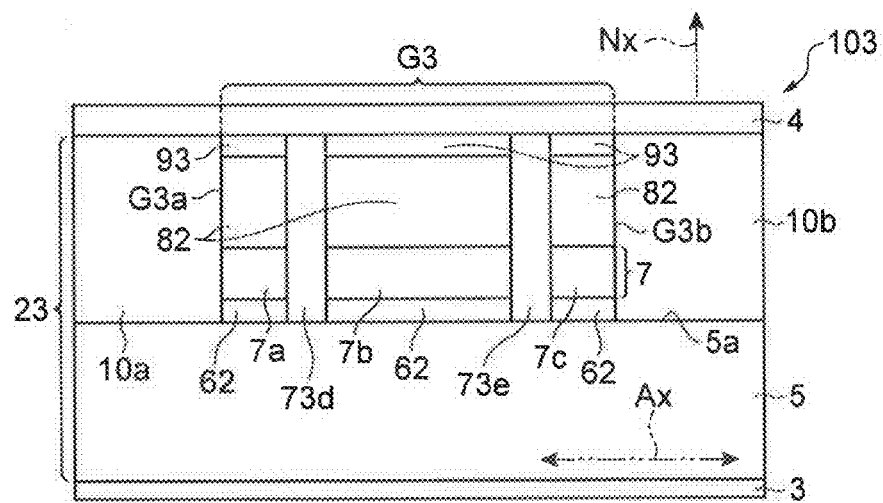
FIGS. 7A and 7B show structures of other quantum cascade lasers according to the embodiment.
Figure 7B:
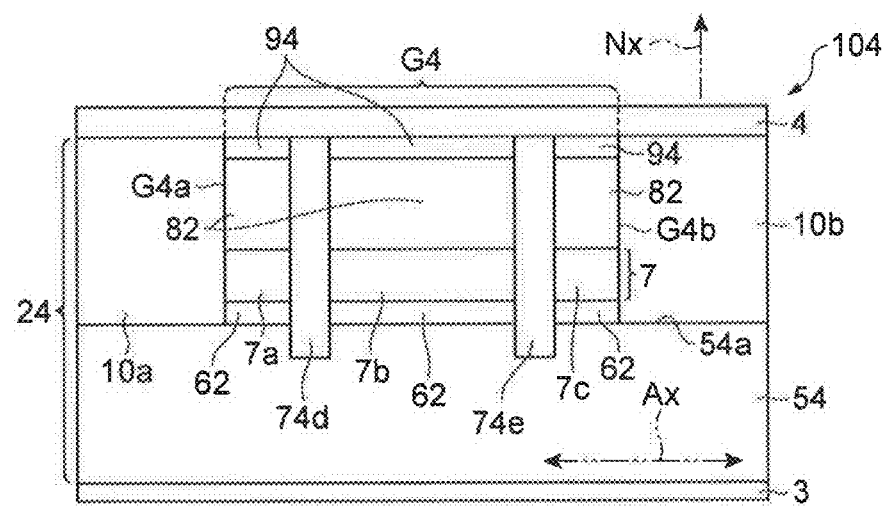

As shown in FIG. 7A, buried regions (buried regions 73d and 73e) in a quantum cascade laser 103 may be extended from a principal surface 5a of an n-type semiconductor substrate 5 to an upper electrode 4 through an n-type lower cladding layer 62, a light emitting region 7, an n-type upper cladding layer 82, and an n-type contact layer 93. Alternatively, as shown in FIG. 7B, buried regions (buried regions 74d and 74e) in a quantum cascade laser 104 may be extended from a middle portion of a substrate (n-type semiconductor substrate 54) to an upper electrode 4 through an n-type lower cladding layer 62, a light emitting region 7, an n-type upper cladding layer 82, and an n-type contact layer 94. A portion indicated by reference numeral 54a in FIG. 7B corresponds to a principal surface of the n-type semiconductor substrate 54.

The quantum cascade laser 103 includes a semiconductor layer 23. The semiconductor layer 23 includes a mesa waveguide G3. The mesa waveguide G3 includes the buried region 73d and the buried region 73e. The mesa waveguide G3 also includes the n-type upper cladding layer 82 and the n-type lower cladding layer 62. A current blocking layer 10a is provided on a side surface G3a of the mesa waveguide G3. A current blocking layer 10b is provided on a side surface G3b of the mesa waveguide G3. The buried region 73d and the buried region 73e are extended from the principal surface 5a of the n-type semiconductor substrate 5 to the upper electrode 4 through the n-type lower cladding layer 62, the light emitting region 7, the n-type upper cladding layer 82, and the n-type contact layer 93. In this way, the quantum cascade laser 1 and the quantum cascade laser 103 differ only in the forms of the buried regions.

The quantum cascade laser 104 includes a semiconductor layer 24. The semiconductor layer 24 includes a mesa waveguide G4. The mesa waveguide G4 includes the buried region 74d and the buried region 74e. The mesa waveguide G4 also includes the n-type upper cladding layer 82 and the n-type lower cladding layer 62. A current blocking layer 10a is provided on a side surface G4a of the mesa waveguide G4. A current blocking layer 10b is provided on a side surface G4b of the mesa waveguide G4. The buried regions 74d and 74e are extended from the middle portion of the n-type semiconductor substrate 54 to the upper electrode 4 through the n-type lower cladding layer 62, the light emitting region 7, the n-type upper cladding layer 82, and the n-type contact layer 94. In this way, the quantum cascade laser 1 and the quantum cascade laser 104 differ only in the forms of the buried regions.

In the second embodiment, the widths of the core regions at the peripheral portions are smaller than the width of the core region at the central portion. Therefore, as in the first embodiment, the bandwidth of the gain spectrum is considerably broader than those of the gain spectra in conventional structures. The QCL device in the second embodiment is also suitable for a broadband light source, such as a wavelength tunable laser. In the second embodiment, the buried regions are extended to regions other than the light emitting region. The buried region is made of, for example, a semi-insulating semiconductor such as Fe-doped InP. Therefore, the resistance between the divided core regions becomes higher as compared to the structure according to the first embodiment. As a result, the insulation property between the divided core regions is improved. Leakage current that flows between the core regions may be reduced. In the second embodiment, it is possible to further improve QCL characteristics; for example, threshold current may be reduced.

Third Embodiment

In each of the first and second embodiments above, as a current confinement structure, the QCL device includes a BH structure including current blocking layers formed of a semi-insulating semiconductor such as Fe-doped InP. However, the current confinement structure is not limited thereto. For example, in a quantum cascade laser 105 shown in FIG. 8, an insulating film 11a and an insulating film 11b are formed on side surfaces Ga and Gb of a mesa waveguide G, respectively as the current confinement structure.

Figure 8:
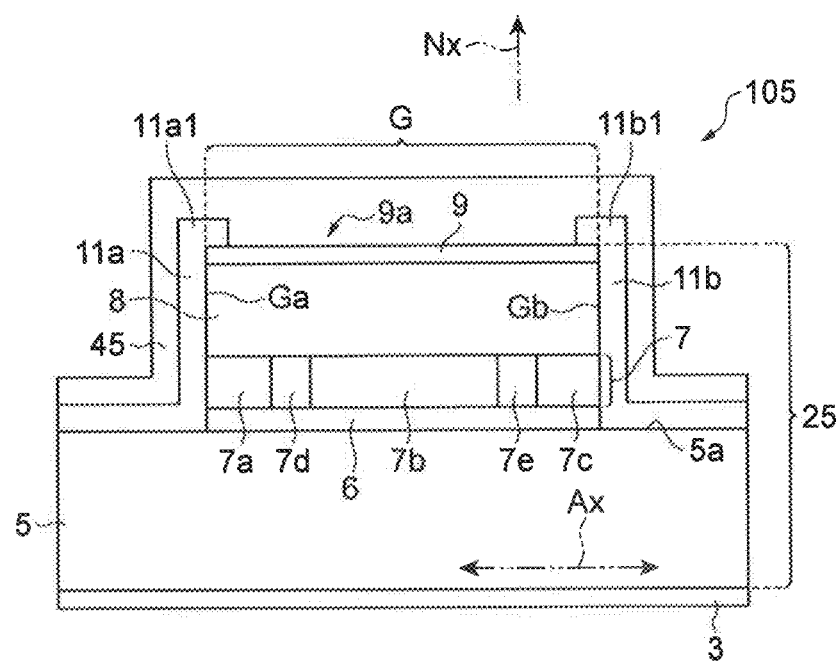
FIG. 8 shows a structure of other quantum cascade laser according to an embodiment.

The quantum cascade laser 105 shown in FIG. 8 includes a semiconductor layer 25. The semiconductor layer 25 includes an n-type semiconductor substrate 5 and a mesa waveguide G. However, the semiconductor layer 25 does not include the current blocking layers 10a and 10b that the semiconductor layer 2 includes in the first embodiment. The insulating films 11a and 11b are each another example of the current blocking layer. The insulating films 11a and 11b may each be formed of, for example, a dielectric film (such as a $SiO_2$, SiON, SiN, or alumina dielectric film) or a resin material (such as benzocyclobutene (BCB) resin or polyimide resin). The insulating film 11a includes an edge portion 11a1. The insulating film 11b includes an edge portion 11b1. The edge portions 11a1 and 11b1 are provided on a surface of an n-type contact layer 9. The edge portion 11a1 is superposed upon a portion of an edge of the surface of the n-type contact layer 9. The edge portion 11b is superposed upon a portion of an edge of the surface of the n-type contact layer 9. By the edge portions 11a1 and 11b1, an opening 9a is defined on the surface of the n-type contact layer 9. The surface of the n-type contact layer 9 is exposed via the opening 9a.

The aforementioned dielectric films have hitherto been generally used as protective films of a semiconductor device, and have a good insulating property. The dielectric films are easily formed using a general deposition method such as a sputtering method and a CVD method. The resin layers are easily formed using, for example, a spin coat method. The quantum cascade laser 105 includes an upper electrode 45. The upper electrode 45 is formed on the insulating film 11a, the insulating film 11b, and the n-type contact layer 9. The upper electrode 45 is in direct contact with the surface of the n-type contact layer 9 via the opening 9a. The upper electrode 45 covers the surface of the n-type contact layer 9.

In the third embodiment, the widths of core regions at peripheral portions are smaller than the width of a core region at a central portion. Therefore, as in the first embodiment, the bandwidth of the gain spectrum is considerably broader than those of the gain spectrums in conventional structures. The QCL device in the third embodiment is also suitable for a broadband light source, such as a wavelength tunable laser. In the current confinement structure of the QCL device in the third embodiment, dielectric films or resins differing from a semiconductor are used as materials of the current blocking layers. Therefore, it is not necessary to grow current blocking layers by using epitaxial growth method. Consequently, compared to the production process of the QCL device in each of the first and second embodiments using semiconductor for the current blocking layers, the production process of the QCL device in the third embodiment may be simplified.

Figure 6B:
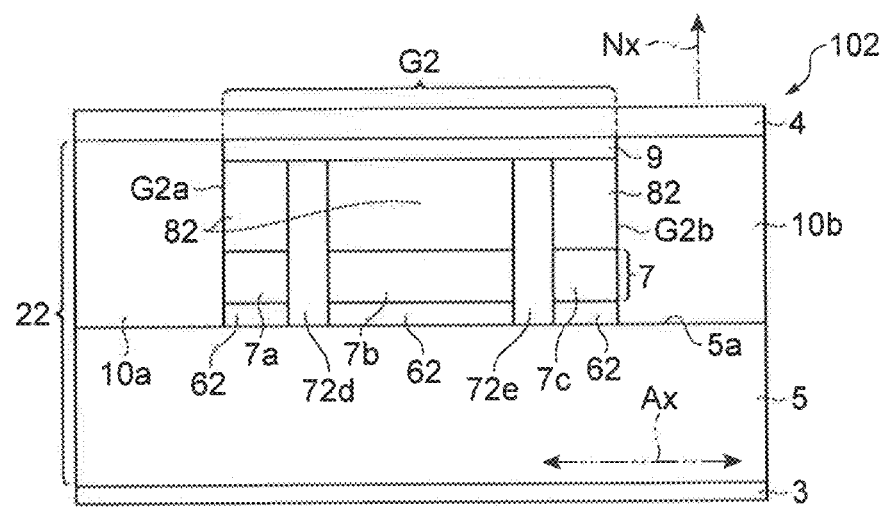
Figure 9A:
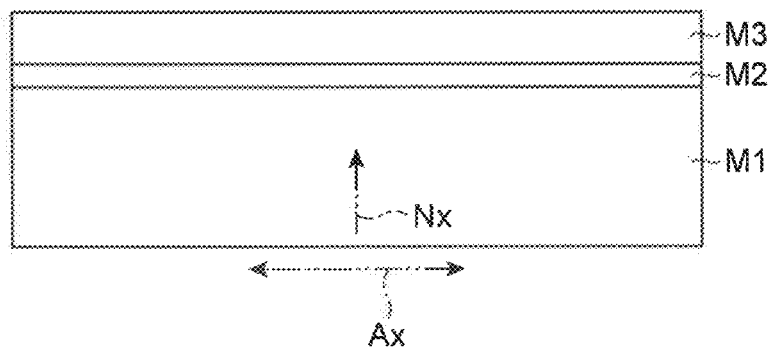
FIGS. 9A, 9B, and 9C show a method for producing the quantum cascade lasers according to the embodiments.

Next, methods for producing the quantum cascade laser 1 shown in FIG. 1, the quantum cascade laser 101 shown in FIG. 6A, the quantum cascade laser 102 shown in FIG. 6B, the quantum cascade laser 103 shown in FIG. 7A, and the quantum cascade laser 104 shown in FIG. 7B will be described. First, the method for producing the quantum cascade laser 1 shown in FIG. 1 is described with reference to FIGS. 9A to 12B. First, as shown in FIG. 9A, in a first growth, an n-type lower cladding layer M2 is grown on an n-type semiconductor substrate M1, and a core region M3 (light emitting region) is grown on the n-type lower cladding layer M2.

Figure 9B:
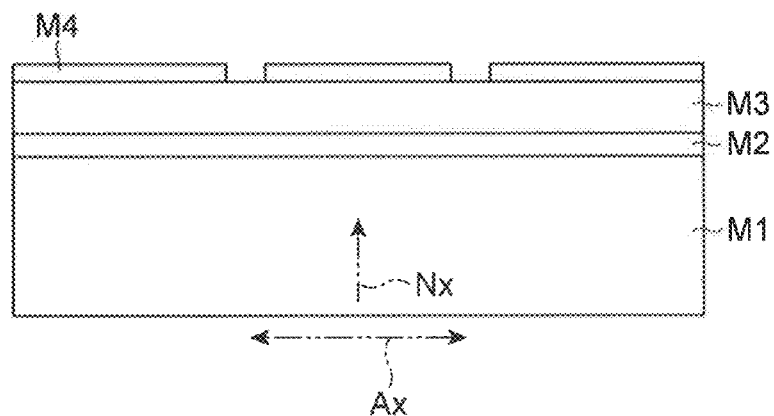

Next, as shown in FIG. 9B, by using photolithography method, a mask M4 for forming divided cores (three division structure in the embodiment) is formed on the core region M3. As crystal growth equipment, for example, an organometallic vapor-phase epitaxy (OMVPE) equipment or molecular beam epitaxy (MBE) equipment is used. The mask M4 is formed of a dielectric film such as a SiN, SiON, or $SiO_2$ film.

Figure 9C:
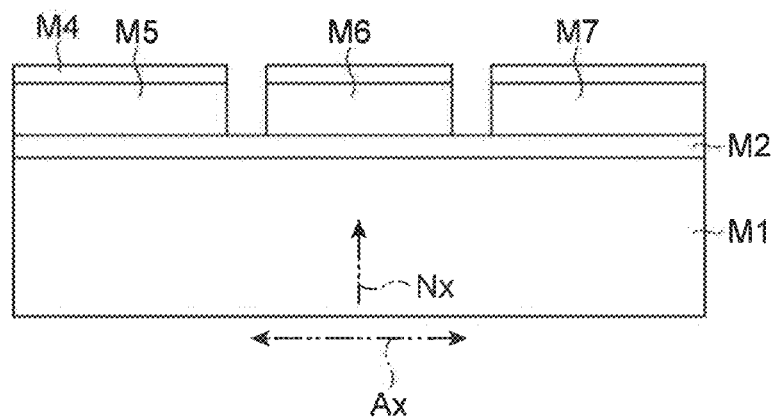

Next, using the mask M4, the core region M3 is etched by wet etching or dry etching. This etching is made until the n-type lower cladding layer M2 is exposed. As shown in FIG. 9C, the core region M3 is divided into three regions, that is, a first core region M6 and second core regions M5 and M7 on respective sides of the first core region M6.

Figure 10A:
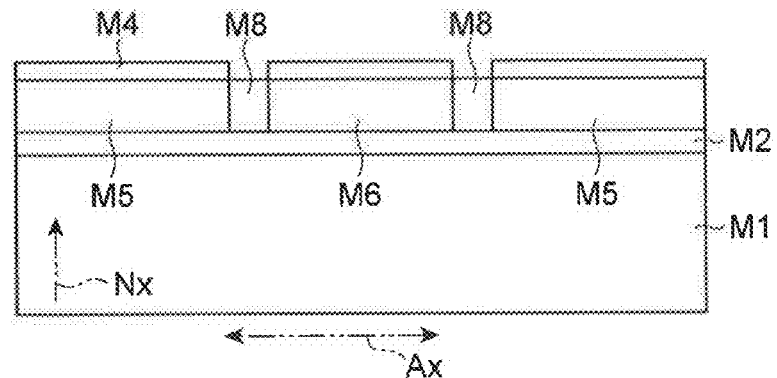
FIGS. 10A, 10B, and 10C show the method for producing the quantum cascade lasers according to the embodiments.

Next, in a second growth, with the mask M4 being provided, semi-insulating semiconductor layers, such as Fe-doped InP layers, are selectively grown on the n-type lower cladding layer M2. As shown in FIG. 10A, two gaps formed by etching the core region M3 (that is, the gap between the second core region M5 and the first core region M6 and the gap between the first core region M6 and the second core region M7) are completely buried with the semi-insulating semiconductor layers. The semi-insulating semiconductor layer is not grown on the mask M4. After the second growth, two buried regions M8 formed of semi-insulating semiconductor having high resistance are formed.

In the embodiment, the core region M3 is etched and divided. However, the structure is not limited thereto. As shown in FIGS. 6A, 6B, 7A, and 7B in the second embodiment, divided structures may be formed so as to include not only the core region M3. That is, they may further include the n-type lower cladding layer M2 and the n-type semiconductor substrate M1 (bottommost portion of the divided structure), or they may even further include an n-type upper cladding layer M9 and an n-type contact layer M10 (topmost portion of the divided structure). These divided structures may be produced using a method that is similar to the production method shown in FIGS. 9A to 10A. That is, first, in a first growth, a stacked semiconductor layer for constituting the divided structure is grown on the n-type semiconductor substrate M1. The stacked semiconductor layer includes the n-type lower cladding layer M2, the core region M3, the n-type upper cladding layer M9, and the n-type contact layer M10, for example. Then, a mask is formed on a top surface of the stacked semiconductor layer, and the stacked semiconductor layer is etched up to a region that becomes the bottommost portion of the divided structure. Thereafter, in a second growth, semi-insulating semiconductor layers are grown in gaps between the divided regions formed by etching. Similarly, after the second growth, buried regions are formed as mentioned above.

Figure 10B:
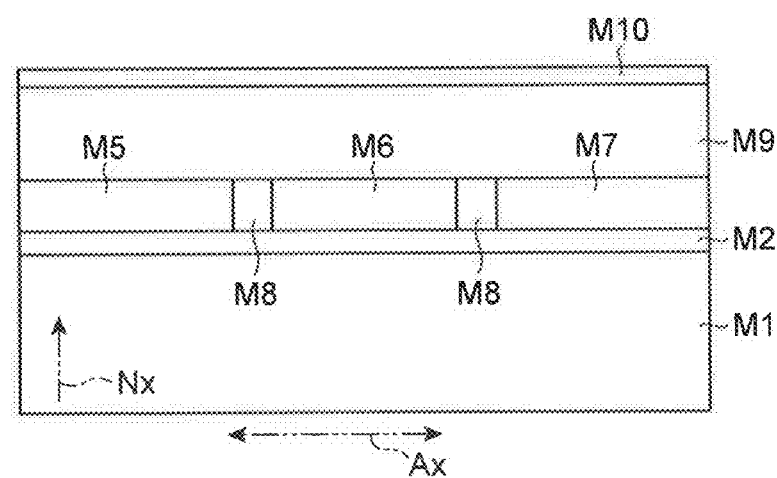

Next, the mask M4, which is a dielectric mask, is removed. As shown in FIG. 10B, in a third growth, the n-type upper cladding layer M9 and the n-type contact layer M10 are grown on the second core region M5, the first core region M6, the second core region M7, and the buried regions M8.

Figure 10C:
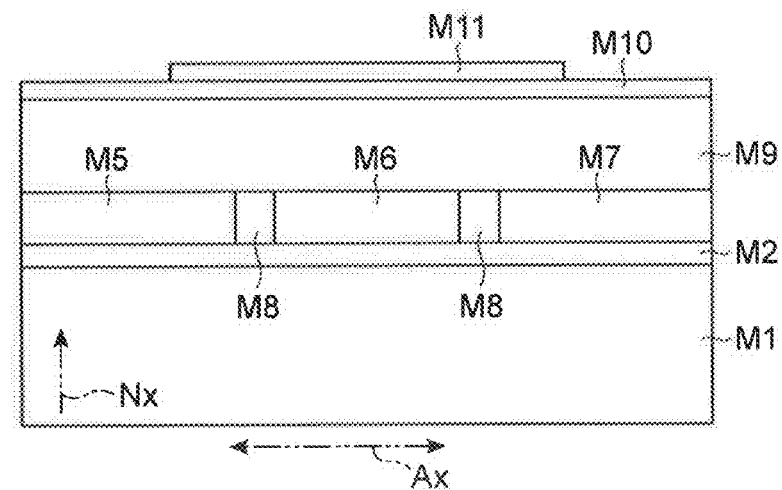
Figure 11A:
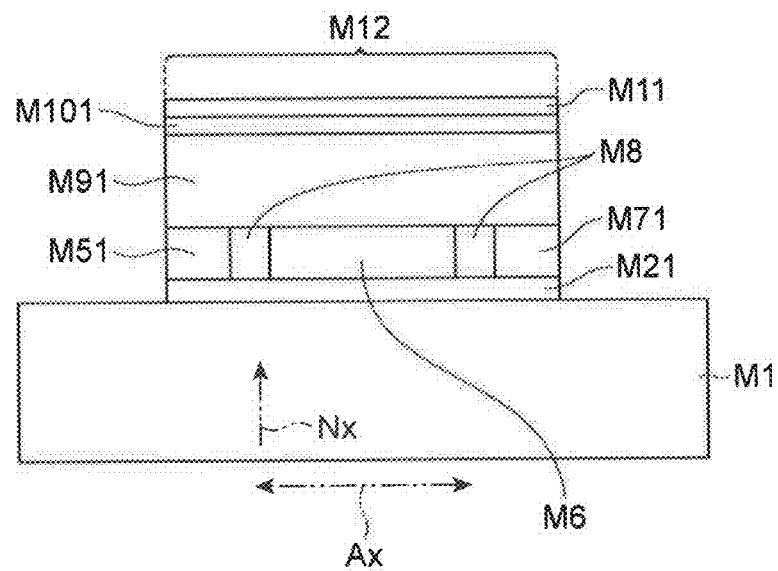
FIGS. 11A and 11B illustrate the method for producing the quantum cascade lasers according to the embodiments.

Next, as shown in FIG. 10C, a mask 11 is formed on the n-type contact layer M10 for forming a mesa waveguide M12 (described later). Using this mask M11, the semiconductor layers (that is, the n-type lower cladding layer M2, the core region M3 (second core regions M5 and M7), the n-type upper cladding layer M9, and the n-type contact layer M10) are etched by using wet etching or dry etching until the n-type semiconductor substrate M1 is exposed. By the etching, as shown in FIG. 11A, the mesa waveguide M12 corresponding to the mesa waveguide G is formed. Also in this case, the mask M11 is made of a dielectric film such as a $SiO_2$, SiON, or SiN film. As shown in FIG. 11A, when forming the mesa waveguide M12, the n-type lower cladding layer M2, the second core region M5, the second core region M7, the n-type upper cladding layer M9, and the n-type contact layer M10 are etched, which become, respectively, an n-type lower cladding layer M21, a second core region M51, a second core region M71, an n-type upper cladding layer M91, and an n-type contact layer M101.

Figure 11B:
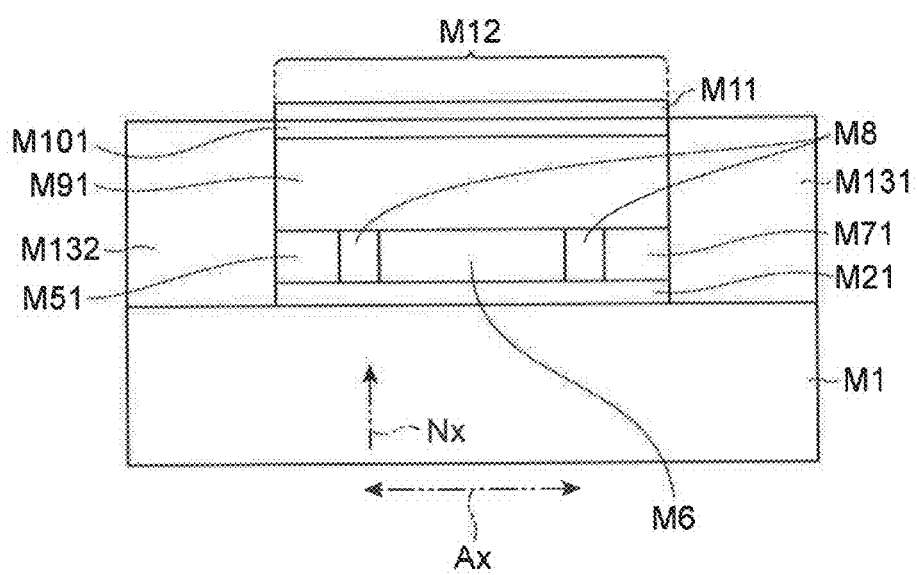

In a fourth growth, with the mask M11 being provided, semi-insulating semiconductor layers, such as Fe-doped InP layers, are selectively grown on the n-type semiconductor substrate M1 and side surfaces of the mesa waveguide M12. As shown in FIG. 11B, a current blocking layer M31 and a current blocking layer M132, which are formed of semi-insulating semiconductor having high resistance, are formed so as to be buried two side surfaces of the mesa waveguide M12. In this growth, the semi-insulating semiconductor layer is not grown on the mask M11.

Figure 12A:
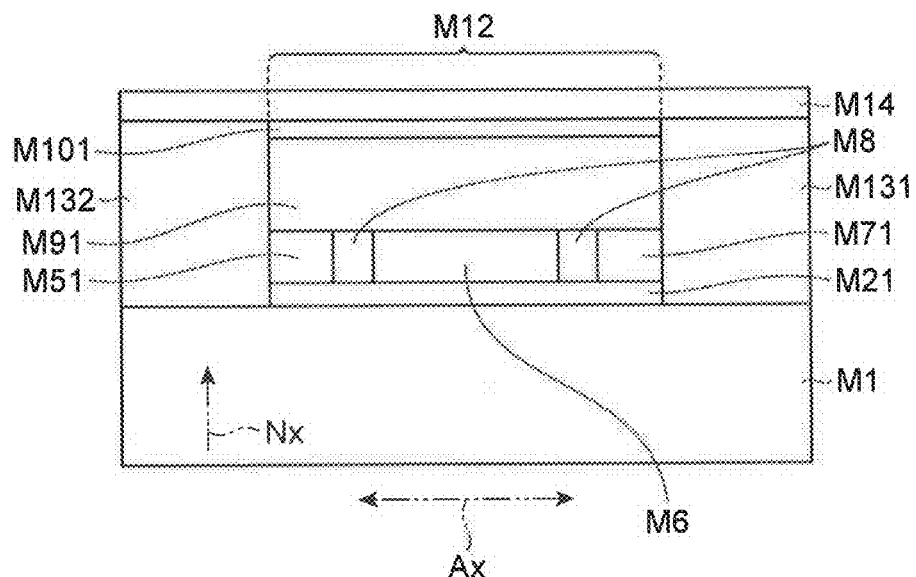
FIGS. 12A and 12B illustrate the method for producing the quantum cascade lasers according to the embodiments.

Then, after removing the mask M11, as shown in FIG. 12A, an upper electrode M14 is formed using an evaporation method or a sputtering method.

Figure 12B:
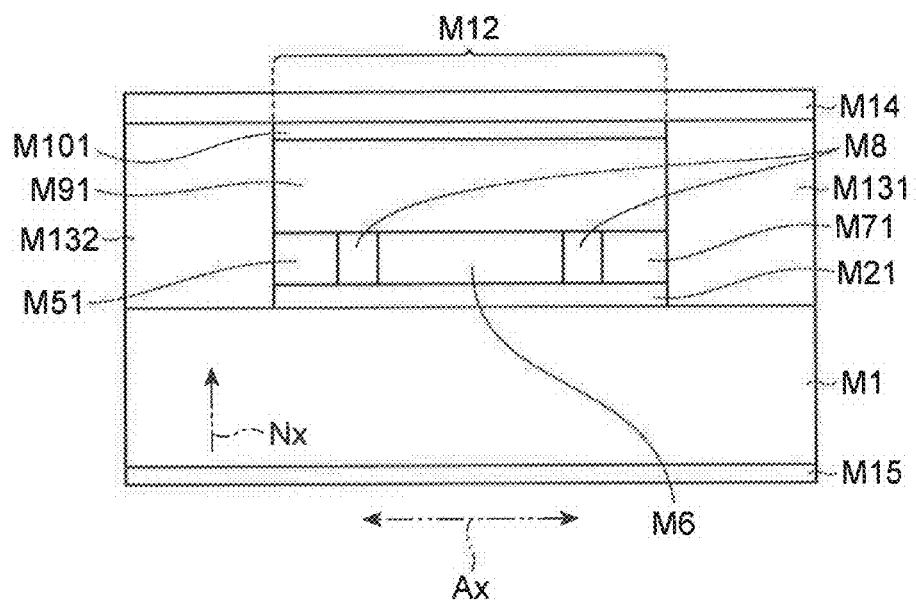

Lastly, by grinding the n-type semiconductor substrate M1, a wafer is made thin to a thickness allowing cleavage (100 µm or less). Then, a lower electrode M15 is formed on a back surface of the n-type semiconductor substrate M1 by using an evaporation method or a sputtering method. By performing the above-described steps, a QCL structure of the quantum cascade laser 1 is completed, as shown in FIG. 12B. It is possible to also form QCL structures of the quantum cascade laser 101 shown in FIG. 6A, the quantum cascade laser 102 shown in FIG. 6B, the quantum cascade laser 103 shown in FIG. 7A, and the quantum cascade laser 104 shown in FIG. 7B by performing a production method including steps that are similar to the steps illustrated in FIGS. 9A to 12B above.

Next, a method for producing the quantum cascade laser 105 shown in FIG. 8 will be described. As with the quantum cascade lasers 1 and 101 to 104, the steps illustrated in FIGS. 9A to 11A are also performed in the fabrication of the quantum cascade laser 105.

Figure 13A:
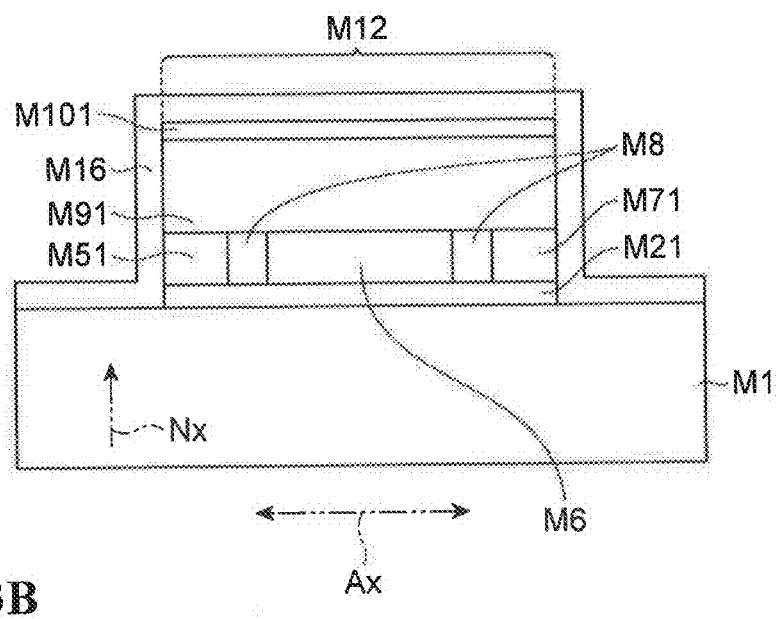
FIGS. 13A and 13B show the method for producing the quantum cascade laser according to the embodiment.

After performing the step illustrated in FIG. 11A, the mask M11 is removed. After removing the mask M11, as shown in FIG. 13A, an insulating layer M16 is formed so as to cover surfaces of the n-type semiconductor substrate M1, a top surface of the mesa waveguide M12, and side surfaces of the mesa waveguide M12. The insulating film M16 is formed of a dielectric film, such as a $SiO_2$, SiON, or SiN film.

Figure 13B:
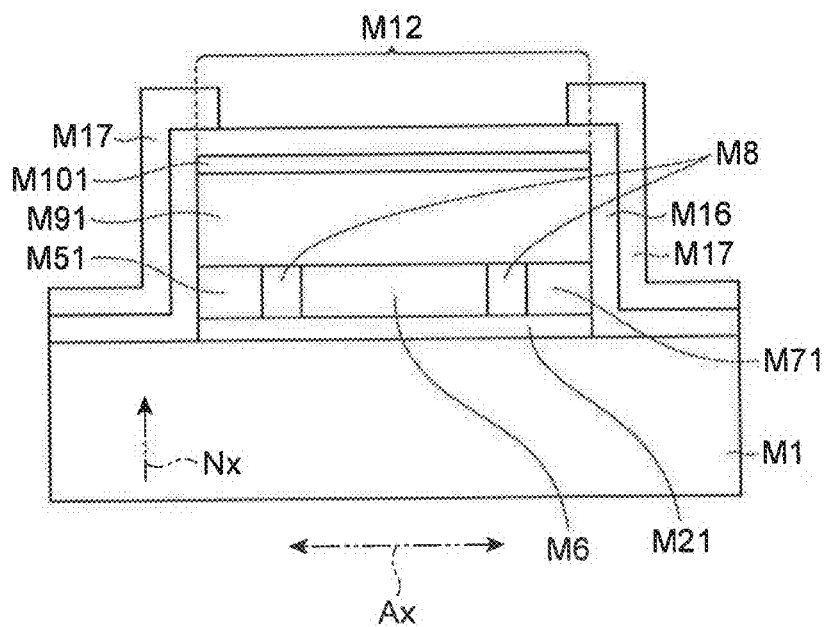

Thereafter, as shown in FIG. 13B, a photoresist mask M17 is formed by using, for example, photolithography method. Regions excluding a top portion of a mesa waveguide M12 are protected by the photoresist mask M17.

Figure 14A:
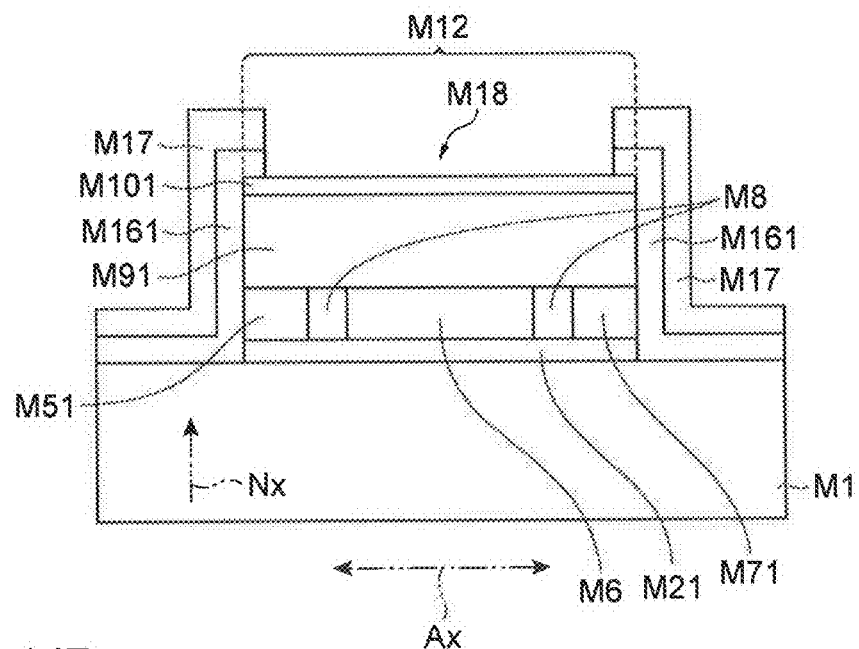
FIGS. 14A and 14B show the method for producing the quantum cascade laser according to the embodiment.

The insulating film M16 is etched by dry etching or wet etching using the photoresist mask M17 as an etching mask. By this etching, as shown in FIG. 14A, only the portion of the insulating film M16 at the top portion of the mesa waveguide M12 is selectively removed, so that an opening M18 is formed. After selectively etching the insulating film M16, the portion of the insulating film M16 remaining on the side surfaces of the mesa waveguide M12 becomes a current blocking layer M161 to confine a current into the mesa waveguide M12.

Figure 14B:
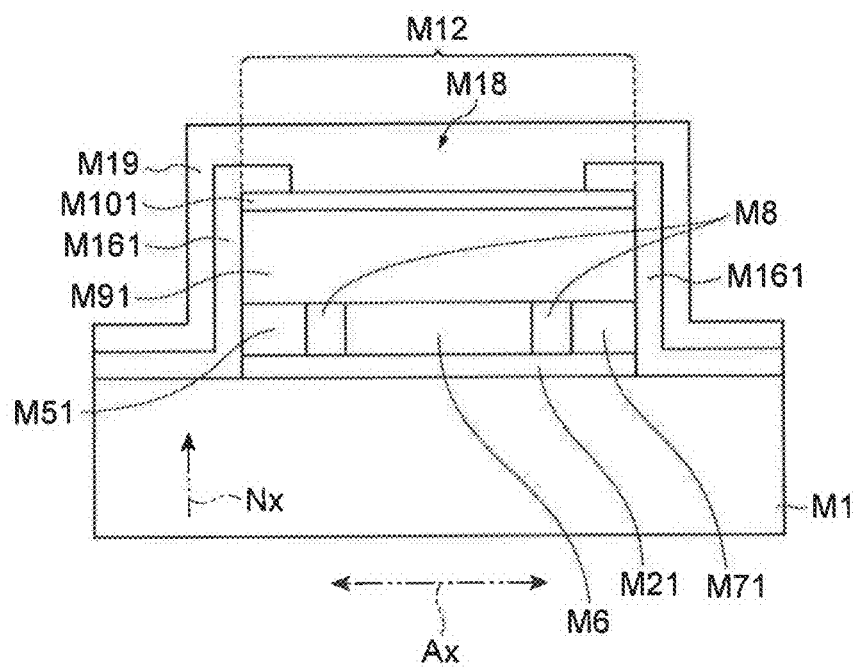

Next, the photoresist mask M17 is removed. By using an evaporation method or a sputtering method, as shown in FIG. 14B, an upper electrode M19 is formed in the opening M18 and on the insulating film M16 (current blocking layer M161).

Figure 15:
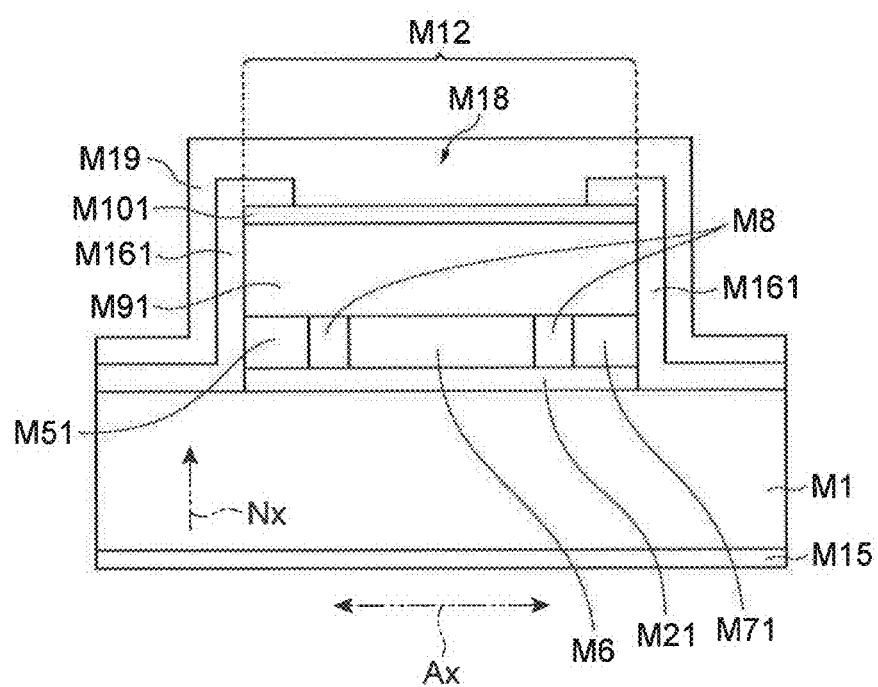
FIG. 15 shows the method for producing the quantum cascade laser according to the embodiment.

Lastly, by, for example, grinding the n-type semiconductor substrate M1, a wafer is made thin to a thickness allowing cleavage (100 µm or less). Then, a lower electrode M15 is formed on a back surface of the n-type semiconductor substrate M1 by using an evaporation method or a sputtering method. By performing the above-described steps, a QCL structure of the quantum cascade laser 105 is completed, as shown in FIG. 15.

Next, with reference to FIG. 16A to 20B, a method for producing a multi-wavelength semiconductor laser array in which DFB-QCLs shown in FIG. 22B are integrated will be described. Similarly to FIG. 22B, FIGS. 16A to 17A are sectional views of a device structure in a cavity direction (longitudinal direction) as seen from a plane that is parallel to the normal direction Nx and orthogonal to the reference direction Ax. FIGS. 17B to 20B are sectional views of a device structure in the reference direction Ax (transverse direction) as seen from a plane defined on the basis of the reference direction Ax and the normal direction Nx at recesses of a diffraction grating layer (described later).

Figure 16A:
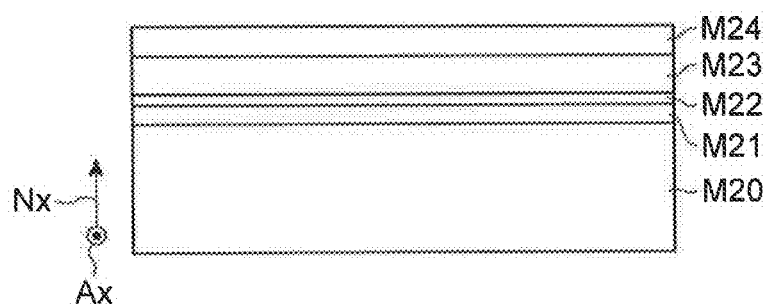
FIGS. 16A, 16B, and 16C show a method for producing a quantum cascade laser according to an embodiment.

First, as shown in FIG. 16A, in a first growth, an n-type lower cladding layer M21, a lower optical confinement layer M22, a core region M23 (light emitting region), and an upper optical confinement layer M24 are grown on an n-type semiconductor substrate M20 so as to form a wafer including the n-type semiconductor substrate M20, the n-type lower cladding layer M21, the lower optical confinement layer M22, the core region M23, and the upper optical confinement layer M24. As crystal growth equipment, OMVPE equipment or MBE equipment is used.

Figure 16B:
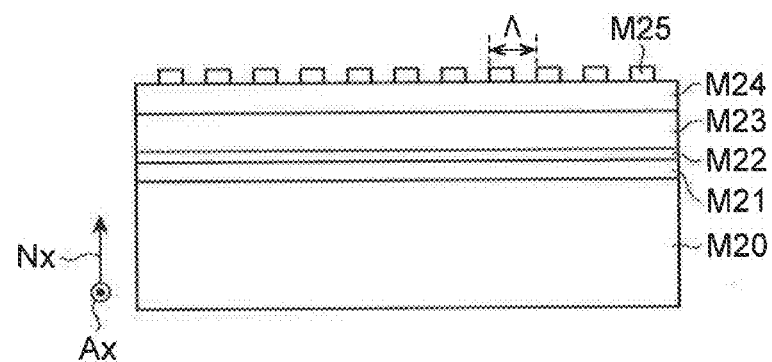

Next, after applying a photoresist to a surface of the wafer (a surface of the upper optical confinement layer M24), as shown in FIG. 16B, a photoresist mask M25 for forming a diffraction grating is formed on the upper optical confinement layer M24 by using, for example, photolithography method or EB lithography method. The photoresist mask M25 includes a periodic pattern which has a period A of the diffraction grating corresponding to an oscillation wavelength. The photoresist mask M25 extends linearly in the reference direction Ax.

Figure 16C:
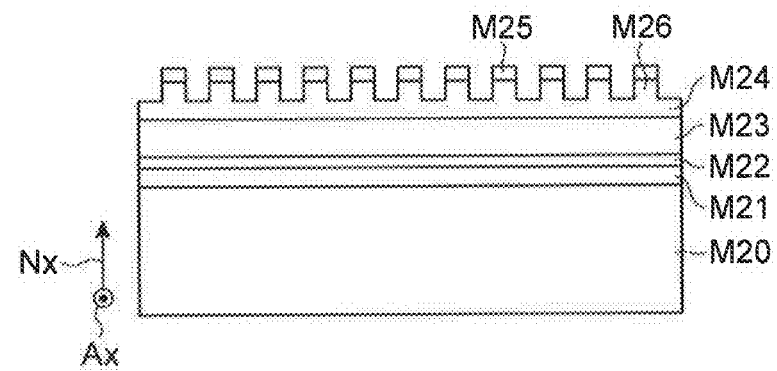

Next, the upper optical confinement layer M24 is etched by wet etching or dry etching using the photoresist mask M25 as an etching mask. Therefore, only regions of the upper optical confinement layer M24 that are not protected by the photoresist mask M25 are etched. As a result, as shown in FIG. 16C, the periodic pattern of the photoresist mask M25 is transferred to the upper optical confinement layer M24. A diffraction grating layer M26 is formed in the upper optical confinement layer M24. The diffraction grating layer M26 includes periodic projections and recesses having the period A. In FIG. 16C, portions of the upper optical confinement layer M24 remain at the recesses of the diffraction grating without being etched. If necessary, the upper optical confinement layer M24 may be completely removed at the recesses. The period A of the photoresist mask M25 at each DFB region is changed as appropriate in accordance with the oscillation wavelength of each DFB region in FIG. 22A. The diffraction grating layer M26 may have a period that is suitable for the oscillation wavelength of each DFB region by adjusting the period A of the photoresist mask M25 at each DFB region.

Figure 17A:
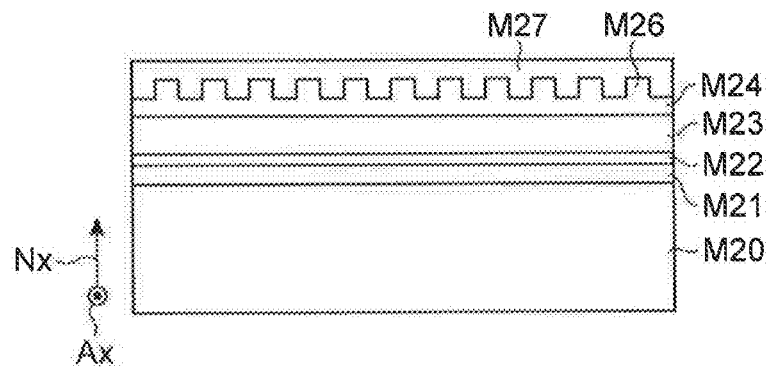
FIGS. 17A, 17B, and 17C show the method for producing the quantum cascade laser according to the embodiment.

Thereafter, the photoresist mask M25 is removed. In a second crystal growth, as shown in FIG. 17A, an n-type upper cladding layer M27 is grown so as to bury the diffraction grating layer M26.

Figure 17B:
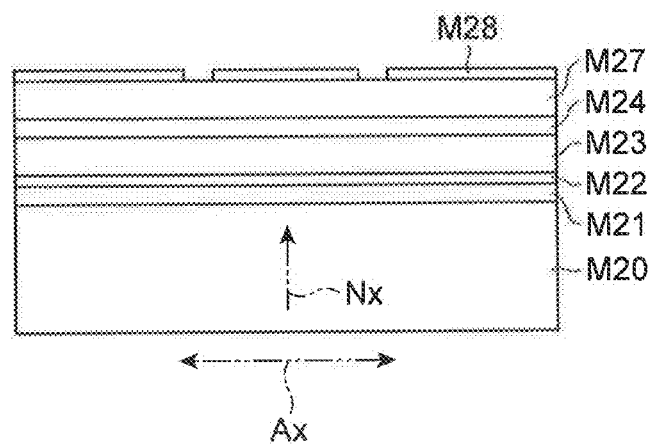

Next, as shown in FIG. 17B, by using, for example, photolithography method, a mask M28 for forming divided cores (three division structure in the embodiment) is formed on the n-type upper cladding layer M27. For example, the mask M28 is formed of a dielectric film such as a SiN, SiON, or $SiO_2$ film. As mentioned above, FIGS. 17B to 20B are sectional views of a device structure as seen from a plane defined on the basis of the reference direction Ax and the normal direction Nx at the recesses of the diffraction grating layer 26. Since the projections of the diffraction grating layer 26 do not exist in these sections, they are not shown in these figures.

Figure 17C:
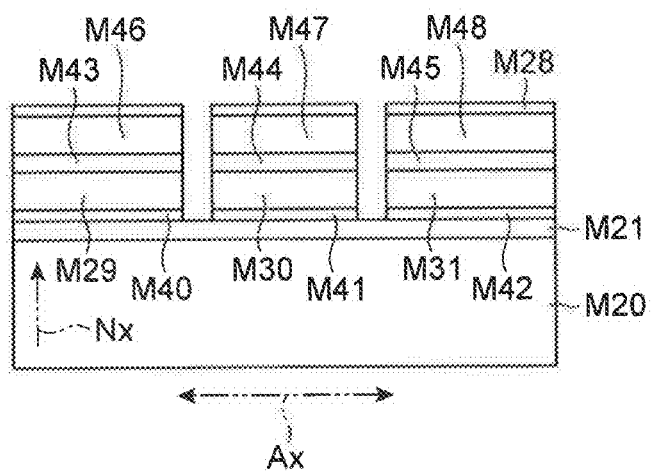

Next, the semiconductor layers including the lower optical confinement layer M22, the core region M23 (light emitting region), the upper optical confinement layer M24, and the n-type upper cladding layer M27 are etched by wet etching or dry etching using the mask M28. This etching is stopped at an interface between the lower optical confinement layer M22 and the n-type lower cladding layer M21. After this etching, the n-type lower cladding layer M21 is exposed through the mask M28. As a result, as shown in FIG. 17C, a core region M23 is divided into three regions, that is, a first core region M30 and second core regions M29 and M31 on respective sides of the first core region M30. As shown in FIG. 17C, as with the core region 23, the lower optical confinement layer M22, the upper optical confinement layer M24, and the n-type upper cladding layer M27 are also divided into three regions. As a result, lower optical confinement layers M40, M41, and M42, upper optical confinement layers M43, M44, and M45, and n-type upper cladding layers M46, M47, and M48 are formed.

Figure 18A:
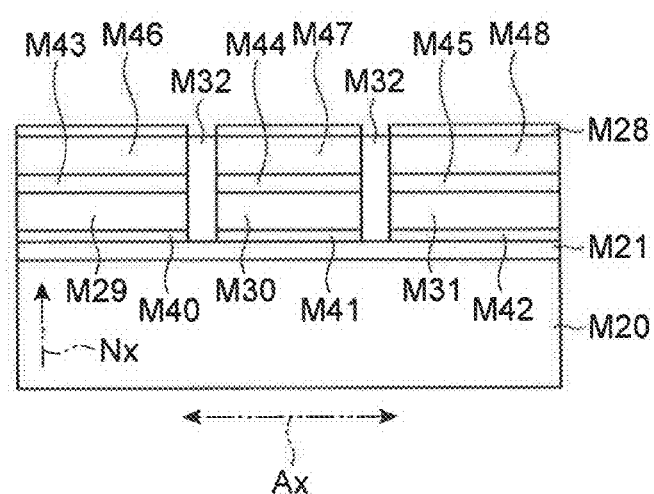
FIGS. 18A and 18B show the method for producing the quantum cascade laser according to the embodiment.

Next, in a third growth, with the mask M28 being provided, semi-insulating semiconductor layers, such as Fe-doped InP layers, are selectively grown on the n-type lower cladding layer M21. As shown in FIG. 18A, buried regions M32, which are formed of semi-insulating semiconductor having high resistance, are formed so as to be buried in gaps formed by etching the core region M23. In the third growth, the semi-insulating semiconductor layer is not grown on the mask M28.

In the embodiment, in order to form divided structures, the semiconductor layers including the lower optical confinement layer M22, the core region M23 (light emitting region), the upper optical confinement layer M24, and the n-type upper cladding layer M27 are etched until the n-type lower cladding layer M21 is exposed. However, as in the second embodiment shown in FIGS. 6A and 6B and FIGS. 7A and 7B, other divided structures may be formed. If necessary, divided structures including the n-type lower cladding layer M21 and the n-type semiconductor substrate M20, or divided structures further including an entire n-type upper cladding layer M34 and an n-type contact layer M35 (described later) may be formed. Alternatively, a structure that is divided by etching up to the core region M23 and is unetched from the lower optical confinement layer M22 to the n-type semiconductor substrate 20 may be used for the divided structures. These divided structures may be produced by performing a method that is similar to the production method shown in FIGS. 17A to 18A above. That is, first, in a second growth, the structure is grown up to a semiconductor layer that becomes the topmost portion of the divided structure. Then, with a mask being formed at a predetermined region of a surface of the semiconductor layer, etching is performed up to a region that becomes the bottommost portion of the divided structure. Thereafter, in a third growth, semi-insulating semiconductor layers are grown in gaps between the divided regions formed by the etching so as to form buried regions.

Figure 18B:
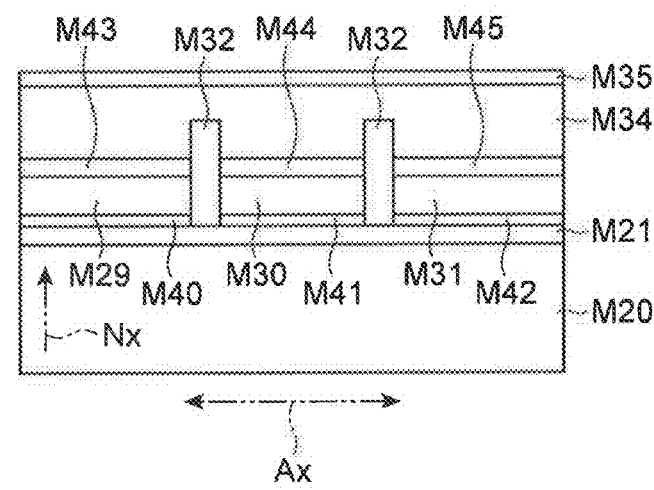
Figure 19A:
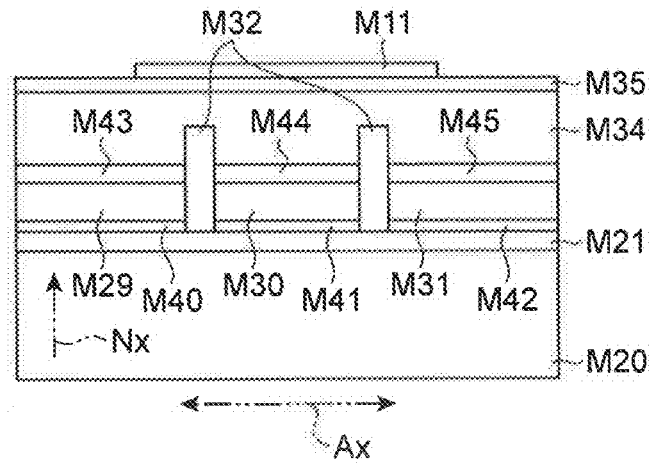
FIGS. 19A, 19B, and 19C show the method for producing the quantum cascade laser according to the embodiment.
Figure 19B:
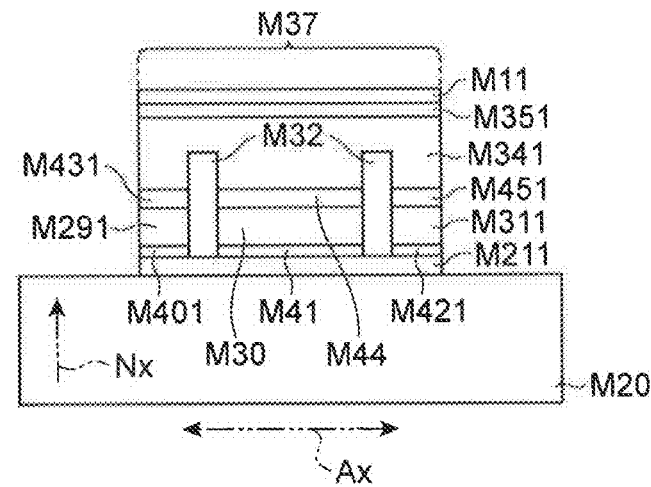
Figure 19C:
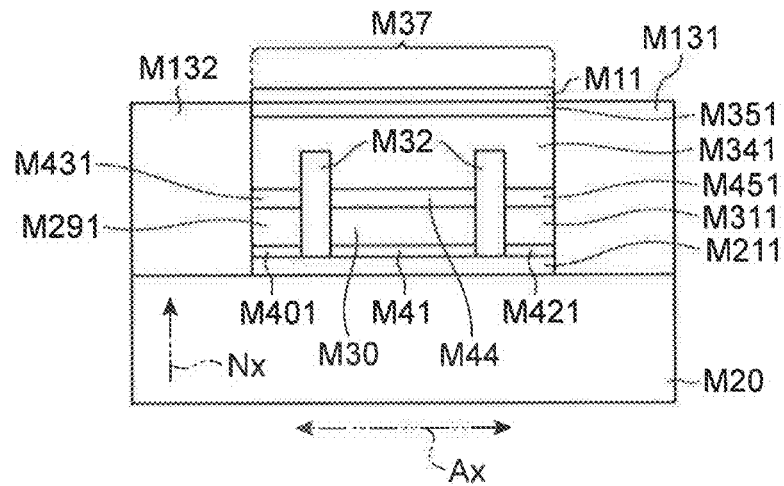
Figure 20A:
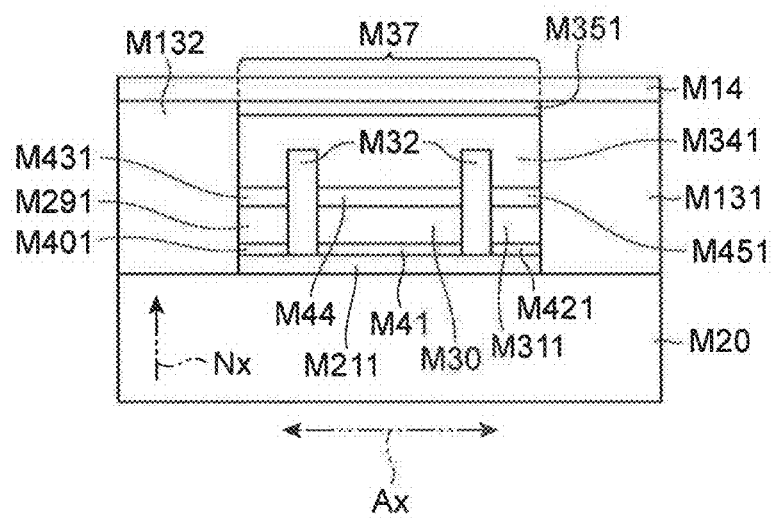
FIGS. 20A and 20B show the method for producing the quantum cascade laser according to the embodiment.
Figure 20B:
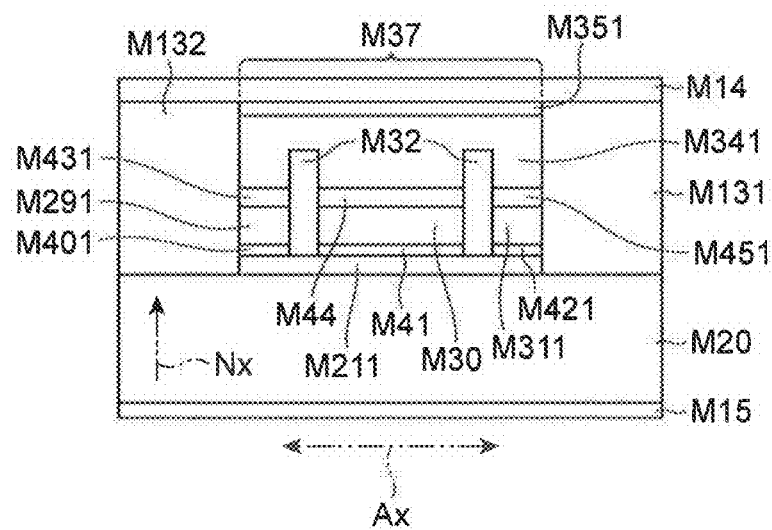

Next, the dielectric mask M28 is removed, and, as shown in FIG. 18B, in a fourth growth, the n-type upper cladding layer M34 (including the layers M46, M47, and M48 remaining after dividing the n-type upper cladding layer M27 by etching, and regions formed by further growing these layers) and an n-type contact layer M35 are grown.

Since the subsequent steps in FIGS. 19A to 20B are the same as the steps in FIGS. 10C to 12B above, they are not described. In FIG. 19B, a mesa waveguide M37 is formed in place of the mesa waveguide M12 shown in FIG. 11A. A current blocking layer M131 and a current blocking layer M132 are grown on side surfaces of the mesa waveguide M37 and on the n-type semiconductor substrate M20. In addition, as shown in FIG. 19B, when forming the mesa waveguide M37, the n-type lower cladding layer M21, the second core region M29, the second core region M31, the n-type upper cladding layer M34, the n-type contact layer M35, the lower optical confinement layer M40, the lower optical confinement layer M42, the upper optical confinement layer M43, and the upper optical confinement layer M45 are etched, so that they become an n-type lower cladding layer M211, a second core region M291, a second core region M311, an n-type upper cladding layer M341, an n-type contact layer M351, a lower optical confinement layer M401, a lower optical confinement layer M421, an upper optical confinement layer M431, and an upper optical confinement layer M451.

Although the principles of the present invention in preferred embodiments are described, any person skilled in the art understands that the present invention may be changed with regard to arrangement and details without departing from such principles. The present invention is not limited to the particular structures disclosed in the embodiments. Therefore, rights regarding all modifications and changes within the scope of the claims and spirit thereof are claimed.

What is claimed is:

1. A quantum cascade laser comprising:
a semiconductor substrate including a principal surface;
a mesa waveguide disposed on the principal surface of the semiconductor substrate, the mesa waveguide including a light emitting region emitting light at a wavelength, and an upper cladding layer disposed on the light emitting region, the mesa waveguide extending in a direction orthogonal to a reference direction; and
a current blocking layer formed on a side surface of the mesa waveguide, wherein
the light emitting region includes a plurality of core regions and a plurality of buried regions that are made of materials different from materials of the core regions,
at least one of the core regions has a width in the reference direction that is less than the wavelength of light emitted from the light emitting region,
the mesa waveguide in configured to form a single waveguide in which light in the light emitting region extends in the reference direction through the core regions,
the core regions and the buried regions are alternately arranged in the reference direction,
the core region at a central portion of the mesa waveguide has a width larger than a width of the core region at a peripheral portion of the mesa waveguide in the reference direction, and
the upper cladding layer is disposed on each of the core regions and the buried regions so that current is injected into the plurality of core regions from the upper cladding layer.

2. The quantum cascade laser according to claim 1, wherein each core region has a width in a range of 0.5 μm to 10 μm in the reference direction.

3. The quantum cascade laser according to claim 1, wherein
each buried region has a width in a range of 0.5 μm to 10 μm the reference direction.

4. The quantum cascade laser according to claim 1, wherein
the plurality of core regions includes a first core region and second core regions,
the first core region is arranged between the second core regions, and
each second core region has a width in a range of 0.125 times to less than 1 times a width of the first core region in the reference direction.

5. The quantum cascade laser according to claim 1, wherein the current blocking layer is formed of an insulating film.

6. The quantum cascade laser according to claim 5, wherein the insulating film is formed of at least one of $SiO_2$, SiON, SiN, alumina, BCB resin, and polyimide resin.

7. The quantum cascade laser according to claim 1, wherein the current blocking layer is formed of a semi-insulating semiconductor.

8. The quantum cascade laser according to claim 1, wherein the current blocking layer is formed of InP or AlInAs doped with at least one of Fe, Ti, Cr, and Co.

9. The quantum cascade laser according to claim 1, wherein the buried regions are formed of a semi-insulating semiconductor.

10. The quantum cascade laser according to claim 1, wherein the buried regions are formed of InP or AlInAs doped with at least one of Fe, Ti, Cr, and Co.

11. The quantum cascade laser according to claim 1, wherein
each of the plurality of core regions includes a plurality of active layers and a plurality of injection layers,
the plurality of active layers and the plurality of injection layers are alternately stacked on the principal surface,
each of the plurality of active layers emits light, and
each of the plurality of injection layers injects carriers into an active layer that is adjacent thereto.

12. A quantum cascade laser comprising:
a semiconductor substrate including a principal surface;
a mesa waveguide disposed on the principal surface of the semiconductor substrate, the mesa waveguide including a light emitting region emitting light at a wavelength, and an upper cladding layer disposed on the light emitting region, the mesa waveguide extending in a direction orthogonal to a reference direction; and a current blocking layer formed on a side surface of the mesa waveguide, wherein the light emitting region includes a plurality of core regions, and a plurality of buried regions that are made of materials different from materials of the core regions, the core regions and the buried regions are alternately arranged in the reference direction, the buried regions are made of a semi-insulating semiconductor having a lower refractive index than a refractive index of the core regions, at least one of the core regions has a width in the reference direction that is less than the wavelength of light emitted from the light emitting region, the plurality of core regions includes a first core region and second core regions, the first core region is arranged between the second core regions, the mesa waveguide is configured to form a single waveguide in which light in the light emitting region extends in the reference direction through the first and second core regions, and in the reference direction, each second core region has a width in a range of 0.125 times to less than 1 times a width of the first core region.

* * * * *